US009575417B2

(12) United States Patent
Shibazaki

(10) Patent No.: US 9,575,417 B2
(45) Date of Patent: Feb. 21, 2017

(54) EXPOSURE APPARATUS INCLUDING A MASK HOLDING DEVICE WHICH HOLDS A PERIPHERY AREA OF A PATTERN AREA OF THE MASK FROM ABOVE

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 333 days.

(21) Appl. No.: 14/245,050

(22) Filed: Apr. 4, 2014

(65) Prior Publication Data

US 2014/0218707 A1 Aug. 7, 2014

Related U.S. Application Data

(60) Division of application No. 13/780,881, filed on Feb. 28, 2013, now Pat. No. 8,735,051, which is a
(Continued)

(30) Foreign Application Priority Data

Dec. 14, 2010 (JP) ................................ 2010-277937

(51) Int. Cl.
*A61N 5/00* (2006.01)
*G03F 7/20* (2006.01)
*H01L 21/027* (2006.01)

(52) U.S. Cl.
CPC ........ *G03F 7/70708* (2013.01); *G03F 7/7035* (2013.01); *G03F 7/70358* (2013.01);
(Continued)

(58) Field of Classification Search
CPC ...... H01J 31/16; H01J 31/128; H01J 37/3171; H01J 37/3174; H01J 37/3175; H01J 2229/07
(Continued)

(56) References Cited

U.S. PATENT DOCUMENTS 4,475,223 A * 10/1984 Taniguchi ............... G03F 7/20
250/491.1
4,749,867 A * 6/1988 Matsushita ......... G03F 7/70691
250/442.11
(Continued)

FOREIGN PATENT DOCUMENTS

JP 57-204547 A 12/1982
JP A-62-79647 4/1987
(Continued)

OTHER PUBLICATIONS

Mar. 19, 2012 International Search Report issued in International Application No. PCT/JP2011/006951 (with translation).
(Continued)

*Primary Examiner* — Jason McCormack
(74) *Attorney, Agent, or Firm* — Oliff PLC

(57) ABSTRACT

An exposure apparatus which transfers a pattern formed on a mask onto a photosensitive substrate placed in proximity to the mask, the apparatus including an illumination optical device which illuminates the mask with an energy beam, a mask holding device which holds a periphery area of a pattern area of the mask from above, and makes a force at least within a plane parallel to a predetermined plane act on the mask and a substrate holding device which moves along the predetermined plane holding the substrate.

43 Claims, 21 Drawing Sheets

Related U.S. Application Data continuation of application No. PCT/JP2011/006951, filed on Dec. 13, 2011.

(52) U.S. Cl.
CPC ...... *G03F 7/70733* (2013.01); *G03F 7/70783* (2013.01); *H01L 21/0273* (2013.01)

(58) Field of Classification Search
USPC ...... 250/492.1, 492.2, 492.21, 492.22, 492.3
See application file for complete search history.

(56) References Cited

U.S. PATENT DOCUMENTS

| | | | |
|---|---|---|---|
| 4,814,615 A * | 3/1989 | Fushimi | B82Y 10/00 250/307 |
| 5,008,702 A | 4/1991 | Tanaka et al. | |
| 5,573,877 A * | 11/1996 | Inoue | G03F 7/7035 250/491.1 |
| 5,891,806 A | 4/1999 | Shibuya et al. | |
| 5,959,304 A * | 9/1999 | Tokita | G03F 7/7035 250/492.2 |
| 6,002,487 A | 12/1999 | Shirata | |
| 6,043,496 A * | 3/2000 | Tennant | G03F 7/203 250/492.1 |
| 6,087,053 A | 7/2000 | Hara | |
| 6,331,885 B1 | 12/2001 | Nishi | |
| 6,552,775 B1 * | 4/2003 | Yanagihara | G03F 7/70225 250/492.2 |
| 6,600,162 B1 * | 7/2003 | Hahmann | B82Y 10/00 250/310 |
| 6,710,353 B1 * | 3/2004 | Loopstra | G03F 7/70758 250/400 |
| 6,869,732 B2 | 3/2005 | Takeuchi et al. | |
| 7,009,683 B2 * | 3/2006 | Sato | G03B 27/42 250/492.2 |
| 7,023,610 B2 | 4/2006 | Ohtsuki et al. | |
| 2002/0041377 A1 | 4/2002 | Hagiwara et al. | |
| 2002/0102482 A1 | 8/2002 | Smith et al. | |
| 2003/0081193 A1 * | 5/2003 | White | B82Y 10/00 355/72 |
| 2003/0211403 A1 | 11/2003 | Mizutani et al. | |
| 2003/0230730 A1 * | 12/2003 | Tokita | G03F 9/7011 250/492.2 |
| 2005/0058913 A1 * | 3/2005 | Osada | B82Y 10/00 430/5 |
| 2005/0194867 A1 * | 9/2005 | Kawakubo | H01G 7/06 310/348 |
| 2006/0124866 A1 * | 6/2006 | Hisatsugu | B82Y 10/00 250/492.2 |
| 2006/0227309 A1 | 10/2006 | Loopstra et al. | |
| 2006/0290915 A1 | 12/2006 | Bijvoet | |
| 2008/0088843 A1 | 4/2008 | Shibazaki | |
| 2009/0040488 A1 | 2/2009 | Shibazaki | |
| 2010/0068660 A1 | 3/2010 | Shibazaki et al. | |
| 2010/0102470 A1 * | 4/2010 | Mokaberi | B82Y 10/00 264/40.5 |
| 2011/0027463 A1 * | 2/2011 | Riordon | H01J 37/20 427/75 |
| 2011/0089345 A1 * | 4/2011 | Komagata | B82Y 10/00 250/492.22 |

FOREIGN PATENT DOCUMENTS

| | | |
|---|---|---|
| JP | 02-072362 A | 3/1990 |
| JP | A-5-190415 | 7/1993 |
| JP | 09-007921 A | 1/1997 |
| JP | 10-312957 A | 11/1998 |
| JP | 11-214302 A | 8/1999 |
| JP | 2000-260690 A | 9/2000 |
| JP | A-2003-295102 | 10/2003 |
| JP | 2004-029748 A | 1/2004 |
| JP | 2006-323268 A | 11/2006 |
| JP | 2007-005789 A | 1/2007 |
| JP | 2007-242707 A | 9/2007 |
| JP | 2009-164283 A | 7/2009 |
| JP | 2010-186918 A | 8/2010 |
| JP | A-2010-250239 | 11/2010 |
| JP | A-2010-266561 | 11/2010 |
| WO | 02/41375 A1 | 5/2002 |
| WO | WO 02/41375 A1 | 5/2002 |
| WO | WO 2010/030018 A2 | 3/2010 |

OTHER PUBLICATIONS

Mar. 19, 2012 Written Opinion of the International Searching Authority issued in International Application No. PCT/JP2011/006951 (with translation).

Mar. 3, 2014 Notice of Allowance issued in U.S. Appl. No. 13/780,881.

Jul. 25, 2013 Office Action issued in U.S. Appl. No. 13/780,881.

* cited by examiner

EXPOSURE APPARATUS INCLUDING A MASK HOLDING DEVICE WHICH HOLDS A PERIPHERY AREA OF A PATTERN AREA OF THE MASK FROM ABOVE

CROSS-REFERENCE TO RELATED APPLICATIONS

This is a divisional of U.S. application Ser. No. 13/780,881 filed Feb. 28, 2013 (now U.S. Pat. No. 8,735,051), which is a continuation of International Application PCT/JP2011/006951, with an international filing date of Dec. 13, 2011, the disclosures of which is hereby incorporated herein by reference in its entirety.

BACKGROUND OF THE INVENTION

Field of the Invention

The present invention relates to exposure methods and exposure apparatuses, and device manufacturing methods, and more particularly to an exposure method and an exposure apparatus by a proximity method used in a lithography process for manufacturing microdevices (electron devices) such as a semiconductor device, a liquid crystal display device and the like, and a device manufacturing method including the lithography process.

Description of the Background Art

For example, when manufacturing a semiconductor device, a liquid crystal display device, or a printed-circuit board and the like in a photolithography process, a proximity exposure apparatus is used which illuminates a photomask or a mask and the like (hereinafter collectively called a "mask") with an exposure light and exposes a pattern of the mask onto a substrate on which a photosensitive material is coated that is placed in proximity with the mask (for example, refer to U.S. Pat. No. 5,891,806).

However, in the conventional proximity exposure apparatus, because the gap (clearance) between the pattern surface of the mask and the surface of a photosensitive layer formed on the substrate by the photosensitive material was minimally around 30 μm, resolution was poor, therefore, the conventional proximity exposure apparatus cannot possibly be used for line widths under 64 nm which is the practical minimum line width of semiconductor devices today, such as, for example, when forming a critical pattern having a line width of 32 nm on a substrate and the like.

In order to resolve a pattern having a line width under 32 nm, exposure should be performed by a double-patterning method using the latest liquid immersion type ArF scanner (scanning stepper), or by using an electron beam or an X-ray (especially an SOR light: synchrotron orbital radiation light) lithography technique.

The liquid immersion type ArF scanner which supports the double-patterning is costly. Further, the electron beam lithography can control pattern forming of a nanometer order with high precision, and also has an advantage of being able to directly draw the pattern on a wafer without using the mask. However, on the contrary, because the electron beam lithography has low throughput and is costly, the electron beam lithography has a disadvantage of still being far from the mass-production level.

Further, in the lithography using the electron beam or the X-ray, a photoresist has to be developed according to the exposure method, and there still are many problems related to sensitivity, resolution, etching resistance and the like.

Therefore, as a method for solving such problems, recently, a method of forming a fine pattern has been proposed (for example, refer to U.S. Pat. No. 6,869,732), in which a near-field light leaking out from an aperture sufficiently smaller than a wavelength of a light that is irradiated serves as a light source to perform exposure and development of the photoresist. According to this method, space resolution of a nanometer order can be obtained, regardless of the wavelength of the light source.

However, in the exposure method disclosed in, for example, U.S. Pat. No. 6,869,732, which substantially employs a contact method, although liquid intervenes between a mask and a substrate, it is actually difficult to avoid damage of the mask, decrease in yield and the like. Because conventional masks are costly, such damages have to be prevented as much as possible. In addition, in this method, because there is no projection optical system, it was difficult to cope with deformation of the mask, such as, for example, deformation of a pattern on the mask (warp, magnification change) caused by thermal deformation of the mask, and decrease in overlay accuracy could not be prevented. This point was also similar in the conventional proximity exposure apparatus.

SUMMARY OF INVENTION

According to a first aspect of the present invention, there is provided an exposure method in which a pattern formed on a mask is transferred onto a photosensitive substrate placed in proximity to the mask, the method comprising: exposing the substrate by irradiating an energy beam on the mask and exposing the substrate with the energy beam via the mask; and performing an overlay of the pattern and a pattern on the substrate, by finely moving the substrate concurrently with the exposing.

According to this method, the pattern on the substrate can be deformed, corresponding to deformation of the mask, such as for example, deformation of the pattern on the mask (distortion, magnification variation) caused by thermal deformation of the mask. Accordingly, it becomes possible to realize a highly precise overlay of the pattern of the mask and the pattern on the substrate.

According to a second aspect of the present invention, there is provided an exposure apparatus which transfers a pattern formed on a mask onto a photosensitive substrate placed in proximity to the mask, the apparatus comprising: an illumination optical device which illuminates the mask with an energy beam; a mask holding device which holds a periphery area of a pattern area of the mask from above, and makes a force at least within a plane parallel to a predetermined plane act on the mask; and a substrate holding device which moves along the predetermined plane holding the substrate.

According to this apparatus, the mask holding device holding the mask holds the periphery area of the pattern area of the mask from above, and can also make a force at least within the plane parallel to the predetermined plane act on the mask. Therefore, corresponding to the deformation of the mask, such as for example, deformation of the pattern on the mask (distortion, magnification variation) caused by thermal deformation of the mask, a force can be applied to the mask to make the deformation of the mask small, which makes it possible to realize a highly precise overlay of the pattern of the mask and the pattern on the substrate.

According to a third aspect of the present invention, there is provided a device manufacturing method in which microdevices are made, the method comprising: designing function/performance of a device, and designing a pattern to achieve the function; forming a plurality of divided areas that have a light shielding area in a periphery of the pattern designed on a glass substrate using lithography technique, and making a plurality of masks by separating the glass substrate for each divided area; installing each of the plurality of masks sequentially into an exposure apparatus which performs exposure with a mask and a substrate in proximity at a predetermined interval, and sequentially transferring a pattern of the mask installed onto each of the number of substrates according to the interval by the exposure apparatus, each time the mask is installed; and developing the substrate on which the pattern is transferred.

According to this method, because a plurality of masks are made by forming a plurality of divided areas that have a light shielding area in a periphery of a pattern designed on a glass substrate using lithography technique, and separating the glass substrate for each divided area, mass production of the mask becomes possible. Further, the plurality of masks that has been produced are each sequentially installed at a predetermined interval into an exposure apparatus which performs exposure in a state where the mask and the substrate are in proximity, and each time the mask is installed, the pattern of the mask installed is sequentially transferred onto the number of substrates corresponding to the interval. Accordingly, by setting the interval described above appropriately, it becomes possible to install a new mask before the current mask exceeds its limitation and is contaminated, which in turn makes it possible to prevent the yield from decreasing.

According to a fourth aspect of the present invention, there is provided an exposure method in which a pattern formed on a mask is transferred onto a photosensitive substrate placed in proximity to the mask, the method comprising: irradiating an energy beam on the mask, and exposing each of a plurality of divided areas on the substrate with the energy beam via the mask, wherein a gap between the mask and the substrate is temporarily widened, during a stepping movement of the substrate between an exposure of one divided area and an exposure of the next divided area of the plurality of divided areas.

According to this method, interference of the mask and the substrate can be avoided for certain during the stepping movement of the substrate.

According to a fifth aspect of the present invention, there is provided a device manufacturing method, comprising: exposing a substrate by the exposure method according to the fourth aspect of the present invention and transferring a pattern formed on the mask onto a plurality of divided areas on the substrate; and developing the substrate on which the pattern is transferred.

According to a sixth aspect of the present invention, there is provided a device manufacturing method, comprising: exposing a substrate by the exposure method according to the first aspect of the present invention and forming a pattern on the substrate; and developing the substrate on which the pattern is formed.

Further, according to a seventh aspect of the present invention, there is provided a device manufacturing method, comprising: exposing a substrate using the exposure apparatus according to the second aspect of the present invention and forming a pattern on the substrate; and developing the substrate on which the pattern is formed.

BRIEF DESCRIPTION OF THE DRAWINGS

In the accompanying drawings.

DESCRIPTION OF THE EMBODIMENTS

Hereinafter, an embodiment will be described, based on FIG. 1 to FIG. 21.

Figure 1:
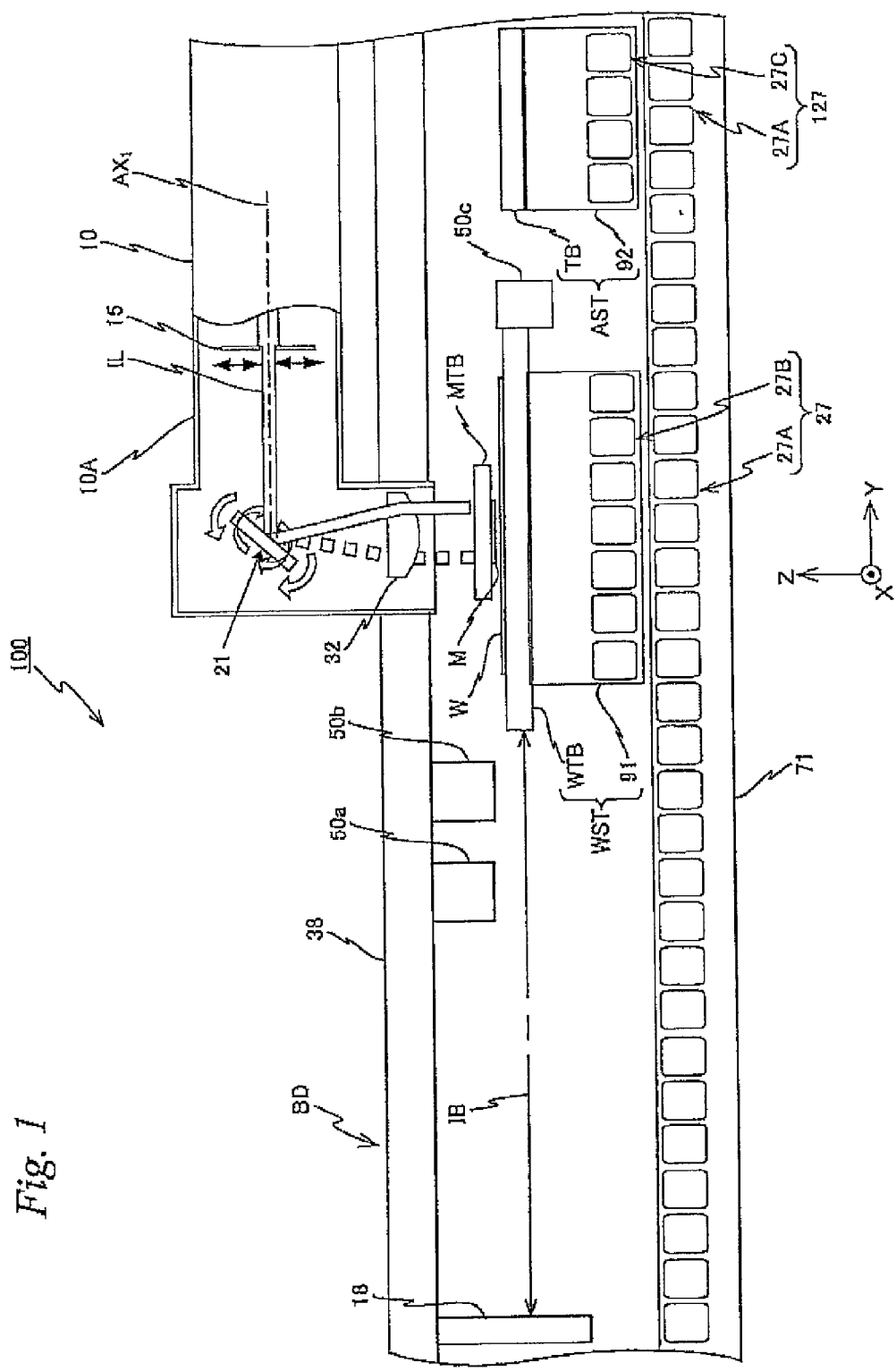
FIG. 1 is a view schematically showing a structure of an exposure apparatus of an embodiment.

FIG. 1 schematically shows a structure of an exposure apparatus 100 related to the embodiment. This exposure apparatus 100 is a proximity exposure apparatus which employs a step-and-repeat method. Hereinafter, the description will be made with the lateral direction of the page surface in FIG. 1 serving as a Y-axis direction, an orthogonal direction of the page surface which is orthogonal to the Y-axis serving as an X-axis direction, and a direction orthogonal to the Y-axis and the X-axis serving as a Z-axis direction.

Exposure apparatus 100 is equipped with an illumination system 10, a mask table MTB which horizontally holds a mask M illuminated by an exposure light (illumination light) IL from the illumination system 10, a wafer stage WST which substantially holds wafer W horizontally below mask M via a predetermined gap and moves two-dimensionally parallel to a horizontal surface on a stage base, an assisting stage AST which moves two-dimensionally on the stage base independent from wafer stage WST, and a controller and the like of such parts.

Illumination system 10 includes an illumination housing 10A, a light source which is not shown housed in a predetermined positional relation inside illumination housing 10A, and an illumination optical system. An outgoing end of illumination housing 10A is supported via a vibration isolation member (not shown), by a support member 38 which structures a body BD placed on a floor surface (or a base plate and the like) via a vibration isolation mechanism that is not shown. Further, in illumination housing 10A, the end opposite to the outgoing end and other parts are mounted on an illumination system support member (not shown) which is different from support member 38. As a matter of course, illumination housing 10A can have the end opposite to the outgoing end and the other parts be supported by support member 38, depending on the shape of support member 38.

As the light source, for example, a super high pressure mercury lamp is used. The illumination optical system is equipped with an elliptic mirror, a wavelength filter plate, a collimator lens, a zoom optical system, an optical integrator, a relay optical system (none of which are not shown), a variable field stop 15, a two-dimensional scanning mirror device 21, a collimator lens 32, and the like.

Here, as the optical integrator, for example, a fly-eye lens is used. As the optical integrator, a rod integrator (an internal reflection integrator), or a diffractive optical element and the like can also be used.

Variable field stop 15, for example, includes two L-shaped blades (or four rectangular shaped blades) that form a rectangular opening, and is also called a movable blind. In variable field stop 15, its opening is set to a rectangular shape of any form and size based on opening setting information, by main controller 20 (not shown in FIG. 1, refer to FIG. 11). In the present embodiment, by this setting of the opening by variable field stop 15, the exposure field will be set to one of three types of fields, as it will be described later on.

As two-dimensional scanning mirror device 21, for example, an oscillating two-dimensional scanner can be used which operates in a two-dimensional direction using an electromagnetic force generated when an electric current is applied to a coil in a magnetic field. This oscillating two-dimensional scanner is equipped with a mechanism section which has a mover having a mirror panel (a planar mirror) on which an inner peripheral coil is formed placed on an inner side of a frame body on which an outer peripheral coil is formed, and the mover consisting of swingably holding the mirror panel and the frame body using a first torsion bar and a second torsion bar extending in a first direction and a second direction which are orthogonal to each other, placed in a magnetic field of a permanent magnet. When an electric current is applied to the inner peripheral coil of the mirror panel, a force corresponding to an electric current value is generated by an interaction with a component of the magnetic field, which rotates the mirror panel until it comes to a position that balances with a restoring force of the first torsion bar. Further, when an electric current is applied to the outer peripheral coil of the frame body, a force corresponding to an electric current value is generated by an interaction with a component of the magnetic field, which rotates the frame body until it comes to a position that balances with a restoring force of the second torsion bar. In this manner, the mirror panel swings around the axis in the first direction and in the second direction.

FIG. 1 representatively shows only the mirror panel structuring this two-dimensional scanning mirror device 21. Hereinafter, the mirror panel will also be described as mirror panel 21, using the same reference code as the two-dimensional scanning mirror device.

In the present embodiment, as shown in FIG. 1, mirror panel 21 is tilted by an angle $\alpha$ ($\alpha$ is an acute angle) with respect to an XY plane, and also extends at a predetermined length in the X-axis direction in a state tilted by (90 degrees-$\alpha$) with respect to an XZ plane. Of the 4 side surfaces of mirror panel 21 excluding a reflecting surface and its rear surface of mirror panel 21, two side surfaces excluding both side surfaces in the X-axis direction is attached to the frame body via a pair of the first torsion bars, so that mirror panel 21 becomes swingable around an axis perpendicular to the X-axis passing through the center of the two side surfaces (hereinafter referred to as a first axis), and both side surfaces in the X-axis direction of mirror panel 21 is supported by a support member not shown via a pair of the second torsion bars, so that the frame body becomes swingable around an axis parallel to the X-axis passing through the center of both side surfaces in the X-axis direction of mirror panel 21 (hereinafter referred to as a second axis). In a reference state where electric current is not supplied to both the inner peripheral coil and the outer peripheral coil, mirror panel 21 and the frame body are tilted by an angle of 45 degrees with respect to the XY plane. Incidentally, as for an oscillating two-dimensional scanner having a structure similar to two-dimensional scanning mirror device 21 in the present embodiment, details are disclosed in detail in, for example, Japanese Unexamined Patent Application Publication No. 2003-295102.

According to illumination system 10, light emitted by the light source is condensed by the elliptic mirror so as to form a light source image, and of the light from this light source image, exposure light in a wavelength band which exposes a photoresist extracted by a wavelength filter plate (for example, a g-line having a wavelength of 436 nm, an i-line having a wavelength of 365 nm, or the like) is incident on the optical integrator, having passed the collimator lens and the zoom optical system. Then, exposure light IL from a secondary light source by the optical integrator is irradiated on variable field stop 15, via the relay optical system (each optical member from the light source to the relay optical system is not shown). Exposure light IL having passed through the aperture of variable field stop 15 becomes an exposure beam having a predetermined sectional area (hereinafter described as exposure beam IL) and irradiates the reflecting surface of mirror panel (two-dimensional scanning mirror device) 21, and exposure beam IL via mirror panel 21 passes through collimator lens 32 and illuminates mask M held by mask table MTB with an almost uniform illuminance (within an irradiation area of exposure beam IL).

In the present embodiment, by the setting of the aperture of variable field stop 15, for example, the sectional shape and the size of exposure beam IL can be changed (set) differently, with an optical axis (referred to as $AX_1$ for the sake of convenience) of a part of the optical system of the illumination optical system shown in FIG. 1, serving as the center. Here, while optical axis $AX_1$ coincides with optical axis AX of the illumination optical system (for example, refer to FIG. 6), here a different reference code is given for the sake of convenience.

For example, at least a rectangular section elongated in the Z-axis direction within a plane orthogonal to optical axis $AX_1$ whose size and shape is almost the same as a shot area on the wafer (a first sectional shape), a sectional shape whose size in the X-direction is almost the same length as the shot area and the length in the Z-axis direction is shorter than the shot area (a second sectional shape), and a square sectional shape which is much smaller than the second sectional shape (a third sectional shape) can be set.

Figure 2A:
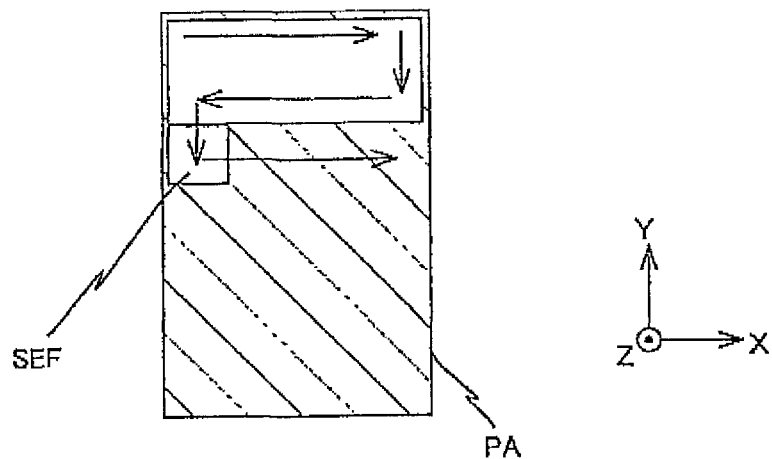
FIGS. 2A, 2B, and 2C are views used for describing a setting of a small exposure field for XY-scan exposure, a middle exposure field for Y-scan exposure, and an overall exposure field for batch exposure, respectively.
Figure 2B:
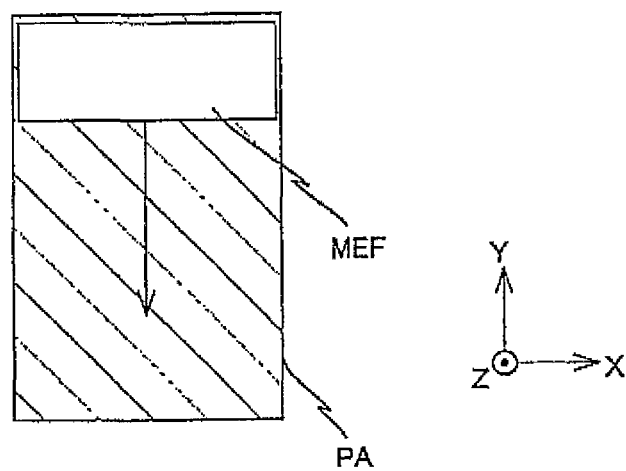
Figure 2C:
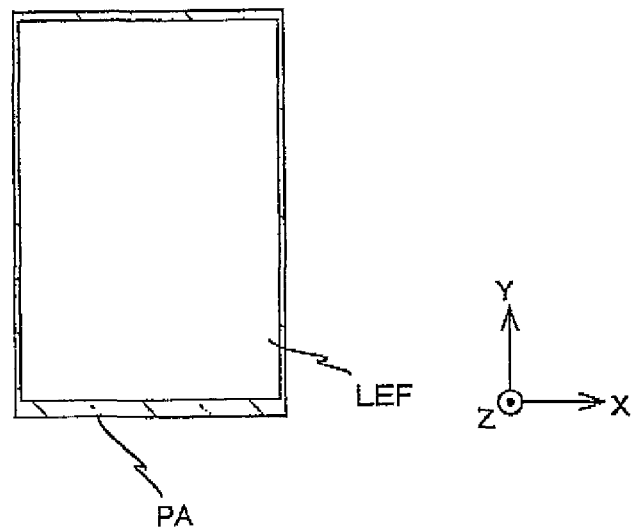
Figure 3:
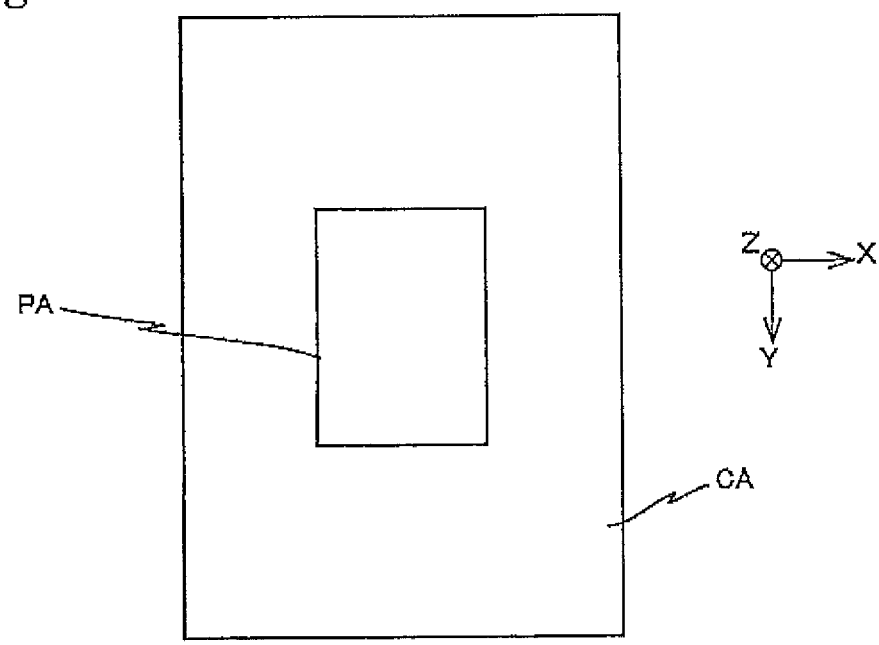
FIG. 3 is a planar view of an example of a mask used in the exposure apparatus in FIG. 1 when viewed from a pattern surface side.

In the present embodiment, by setting exposure beam IL of the first sectional shape, an overall exposure field LEF for batch exposure shown in FIG. 2C is set, by setting exposure beam IL of the second sectional shape, a middle exposure field MEF for Y-scan exposure shown in FIG. 2B is set, and by setting exposure beam IL of the third sectional shape, a small exposure field SEF for XY-scan exposure shown in FIG. 2A is set. Here, according to the setting of the aperture of variable field stop 15, main controller 20 (refer to FIG. 11) drives zoom optical system (not shown), so that exposure beam IL is kept from being irradiated on sections other than the aperture of variable field stop 15 as much as possible, or in other words, so as to suppress light amount loss which accompanies the change of setting of the exposure field (irradiation area of exposure beam IL on mask M).

In the case small exposure field SEF for XY-scan exposure is set, on exposure, mirror panel (two-dimensional scanning mirror device) 21 is controlled by main controller 20, and as shown in FIG. 2A, exposure beam IL irradiated on small exposure field SEF is scanned on a pattern area PA of mask M in the XY two-dimensional direction, for example, in an order indicated by the arrows. Further, in the case middle exposure field MEF for Y-scan exposure is set, on exposure, mirror panel (two-dimensional scanning mirror device) 21 is controlled by main controller 20, and as shown in FIG. 2B, exposure beam IL irradiated on middle exposure field MEF is scanned on pattern area PA of mask M in the Y-axis direction, for example, in a direction indicated by the arrows. That is, in the present embodiment, in the case of the XY two-dimensional scan and in the case of the Y-scan, mask table MTB and wafer stage WST during the exposure are macroscopically stationary. Incidentally, Y-direction scanning in the Y-scan and the XY two-dimensional scan can be performed, by scanning mask table MTB and wafer stage WST synchronously in the Y-axis direction with respect to the exposure beam. In the case, instead of mirror panel 21, a reflection mirror which is swingable only around the X-axis can be used. As a matter of course, the exposure beam, and mask table MTB and wafer stage WST can be mutually scanned in opposite directions.

On mask table MTB, mask M on which a circuit pattern and the like is formed on its pattern surface (lower surface in FIG. 1) is held, for example, by vacuum chucking. To further describe this in detail, mask M, as in an example shown in FIG. 3, has a glass substrate, and a rectangular pattern area PA of a predetermined size such as, for example, 26 mm×33 mm, formed on the glass substrate and a light-shielding area CA in the periphery of pattern area PA. Light-shielding area CA becomes a chucking area which will be described later on, excluding the pattern area and a part near the border, for example, such as the area of a predetermined width which surrounds pattern area PA. Because a large part of light-shielding area CA becomes the chucking area, hereinafter, for the sake of convenience, the chucking area will be referred to as chucking area CA using the same reference code as light-shielding area CA. Pattern area PA actually consists of a light-shielding film, and inside, a plurality of patterns (equal-magnification patterns) including a pattern whose line width is thinner than the resolution limit of an optical exposure apparatus, such as, for example, a pattern with a line width of 32 nm, are formed as an aperture section. Further, on the boundary of pattern area PA within light-shielding area CA, alignment marks are formed which will be described later on.

Returning to FIG. 1, mask table MTB is fixed to support member 38 via a support member not shown, in a suspended state. Mask table MTB is equipped, as shown in the side surface view of FIG. 4A (a view from the +X direction) and the bottom surface view of FIG. 4B (a view from the −Z direction), with a mask base MB, a pin chuck platen 66, and a planar voice coil motor (hereinafter, shortly referred to as plane VCM) 65.

Figure 4A:
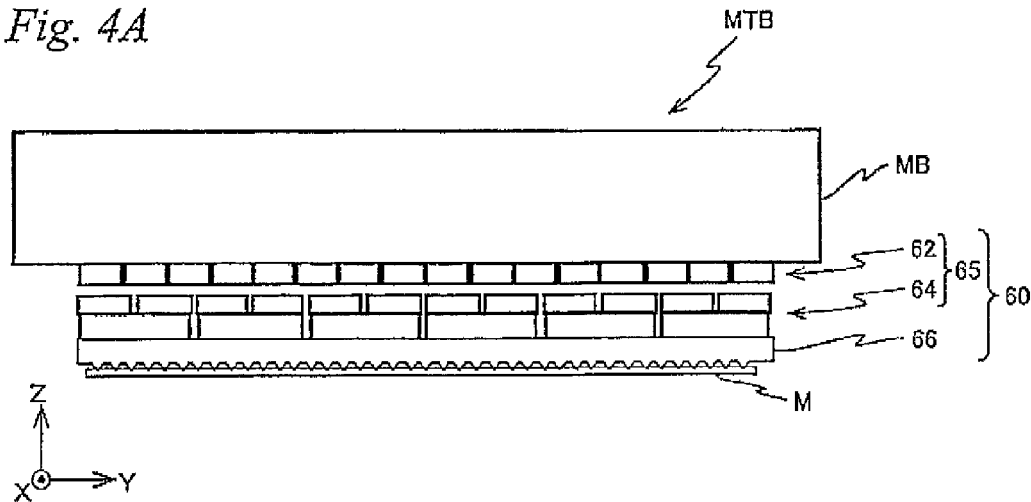
FIG. 4A is a side view of a mask table.
Figure 4B:
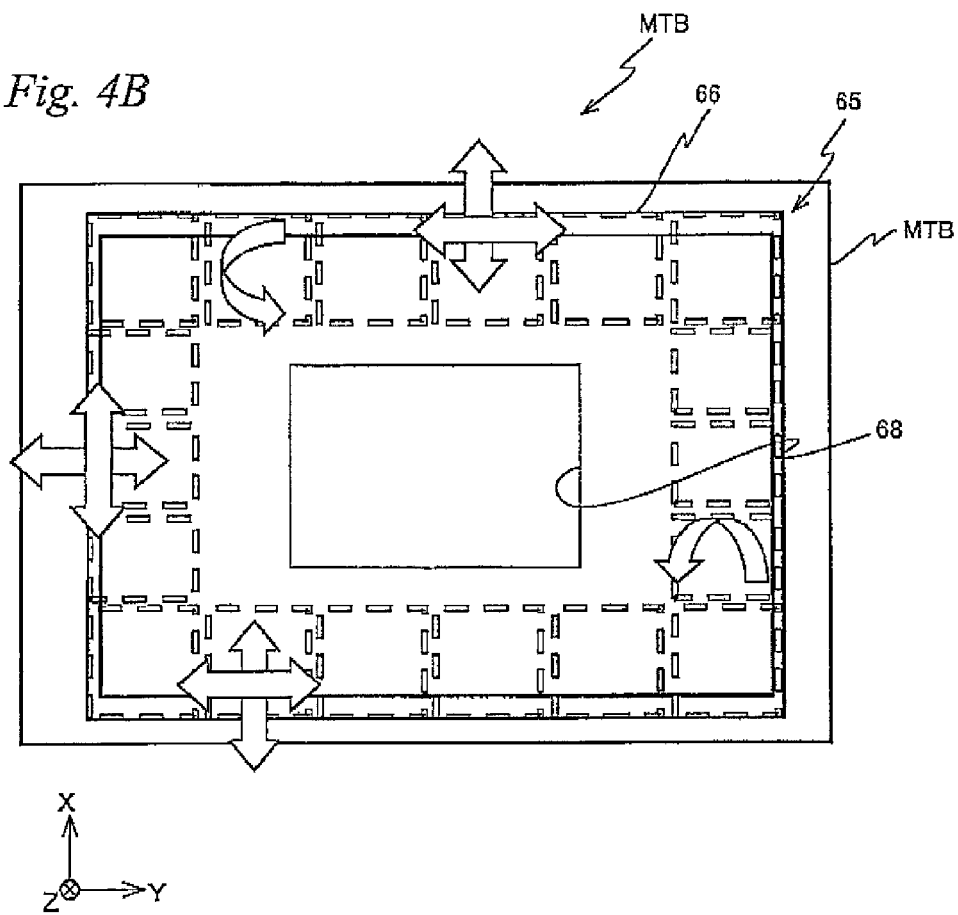
FIG. 4B is a bottom surface view of the mask table.

Mask base MB is fixed to support member 38 via a support member not shown, and is a frame shape member having a rectangular shape opening 68 in the center (refer to FIG. 4B). Opening 68 is a rectangular shaped opening similar to pattern area PA which is slightly larger than pattern area PA of mask M. Pin chuck platen 66 is a pin chuck holder, and like mask base MB, has opening 68 in the center. Further, on the lower surface of pin chuck platen 66 (surface on the −Z side), many pin shaped protruding sections (pin sections) are formed, for example, by an etching process, and mask M is held by pin chuck platen 66, for example, by vacuum suction, in a state where chucking area CA of mask M is pressed to the many pin sections of pin chuck platen 66. Here, in pin chuck platen 66, a vacuum evacuation path (not shown) for suction of mask M is formed. Incidentally, while mask M can be held by mask table MTB not only by vacuum suction but also by mechanical means or by in the case the mask is held by electrostatic suction, attention has to be paid to damage of the pattern of mask M caused by static electricity. Further, in the present embodiment, pin chuck platen 66 is formed of a flexible material, or a material which deforms (bends) when a force is applied and is elastic, such as, for example, a film member.

Plane VCM 65 is placed on the outer side of opening 68 surrounding opening 68, in between mask base MB and pin chuck platen 66.

As is obvious from the description above, in the present embodiment, a common opening 68 is formed which penetrates mask base MB, pin chuck platen 66 and plane VCM 65.

Plane VCM 65 includes a stator 62 fixed to a lower surface of mask base MB (a surface on the −Z side) consisting of, for example, a plurality of coils, and a plurality of movers 64 including a permanent magnet placed below to face stator 62. Here, plane VCM 65 is a magnetic levitation type planar motor which can generate an electromagnetic force (Lorentz force) not only in the X-axis direction and the Y-axis direction, but also in the Z-axis direction. In this case, each of the plurality of movers can move in the X-axis direction, and in the Y-axis direction and the Z-axis direction by the electromagnetic force, and strictly speaking, each of the plurality of movers and a part of stator 62 corresponding to the movers (a part of the coils structuring stator 62) structure the same number of magnetic levitation type planar motors as the mover, and plane VCM 65 is structured by these plurality of planar motors.

Figure 11:
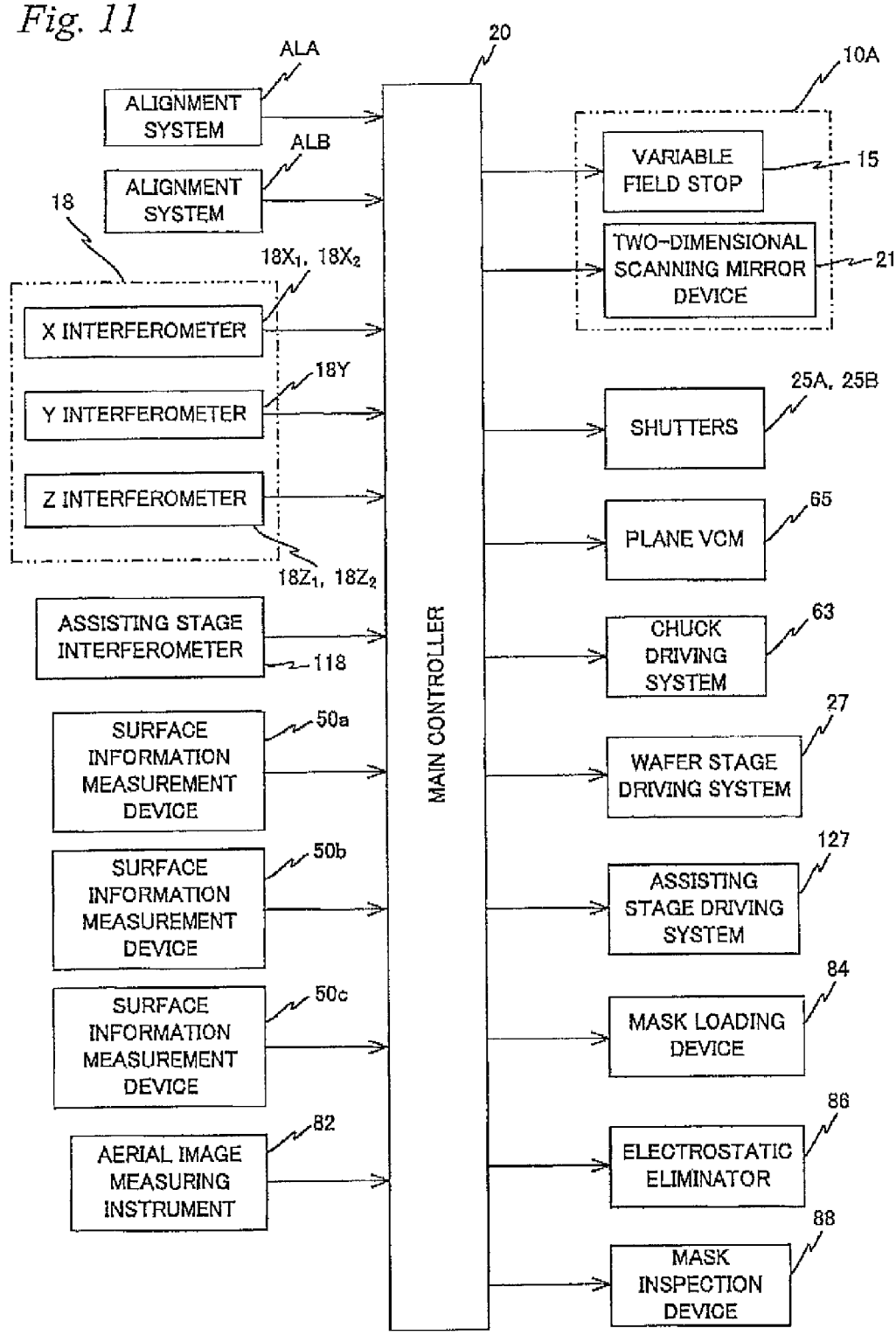
FIG. 11 is a block diagram used to describe an input/output relation of a main controller equipped in the exposure apparatus of FIG. 1.

The magnitude and the direction of electric current supplied to the plurality of coils that structure stator 62 of plane VCM 65 are controlled by main controller 20 (refer to FIG. 11). In this manner, each of the plurality of movers 64 (planes VCM 65) are independently controlled, and a desired position of pin chuck platen 66 can be finely changed (freely) in any direction.

For example, main controller 20 can apply a force to pin chuck platen 66 using plane VCM 65 in the X-axis direction, the Y-axis direction, and an θz direction (a rotation direction around the Z-axis), for example, as shown by the outlined arrows in FIG. 4B, and this can generate a shift in the X-axis direction, a shift in the Y-axis direction, and rotation within the XY plane of mask M suctioned by pin chuck platen 66. Further, because plane VCM 65 can apply a force in the X-axis direction and in the Y-axis direction from both sides of pattern area PA to mask M, by making a force in an opposite direction act from both sides of pattern area PA, a part of, or the whole pattern area can be expanded and contracted in the X-axis direction and in the Y-axis direction. Accordingly, it becomes possible to correct deformation of pattern area PA of mask M to some extent.

Further, by driving a part of movers 64 of plane VCM 65 individually in the Z-axis direction, not only does main controller 20 hold mask M held by suction by pin chuck platen 66 with good flatness, but can also roughly change the bending, for example, can make it warp. However, because pin chuck platen 66 does not face the section of pattern area PA of mask M, it is not easy to precisely correct the unevenness of pattern area PA. Incidentally, here, while mask M was deformed via a part of movers 64 of plane VCM 65, the structure to deform mask M is not limited to this.

Returning to FIG. 1, wafer stage WST is placed on a base board 71, placed on a floor surface (or a base plate and the like) via a vibration isolation mechanism not shown. Wafer stage WST has a stage main section 91, and a wafer table WTB fixed on stage main section 91. On wafer table WTB, wafer W is held by vacuum suction and the like.

Wafer stage WST is driven in directions of six degrees of freedom (in each of the X-axis, the Y-axis, the Z-axis, a θx (rotation around the X-axis), a θy (rotation around the Y-axis), and the θz directions), by a magnetic levitation moving-magnet-type planar motor structured by a coil array (stator) 27A within base board 71, and a magnet array (mover) 27B provided on a bottom surface of stage main section 91. In other words, planar motor (27A, 27B) structures a wafer stage driving system 27 (refer to FIG. 11) which drives wafer stage WST. Wafer stage driving system 27 is controlled by main controller 20.

Figure 5:
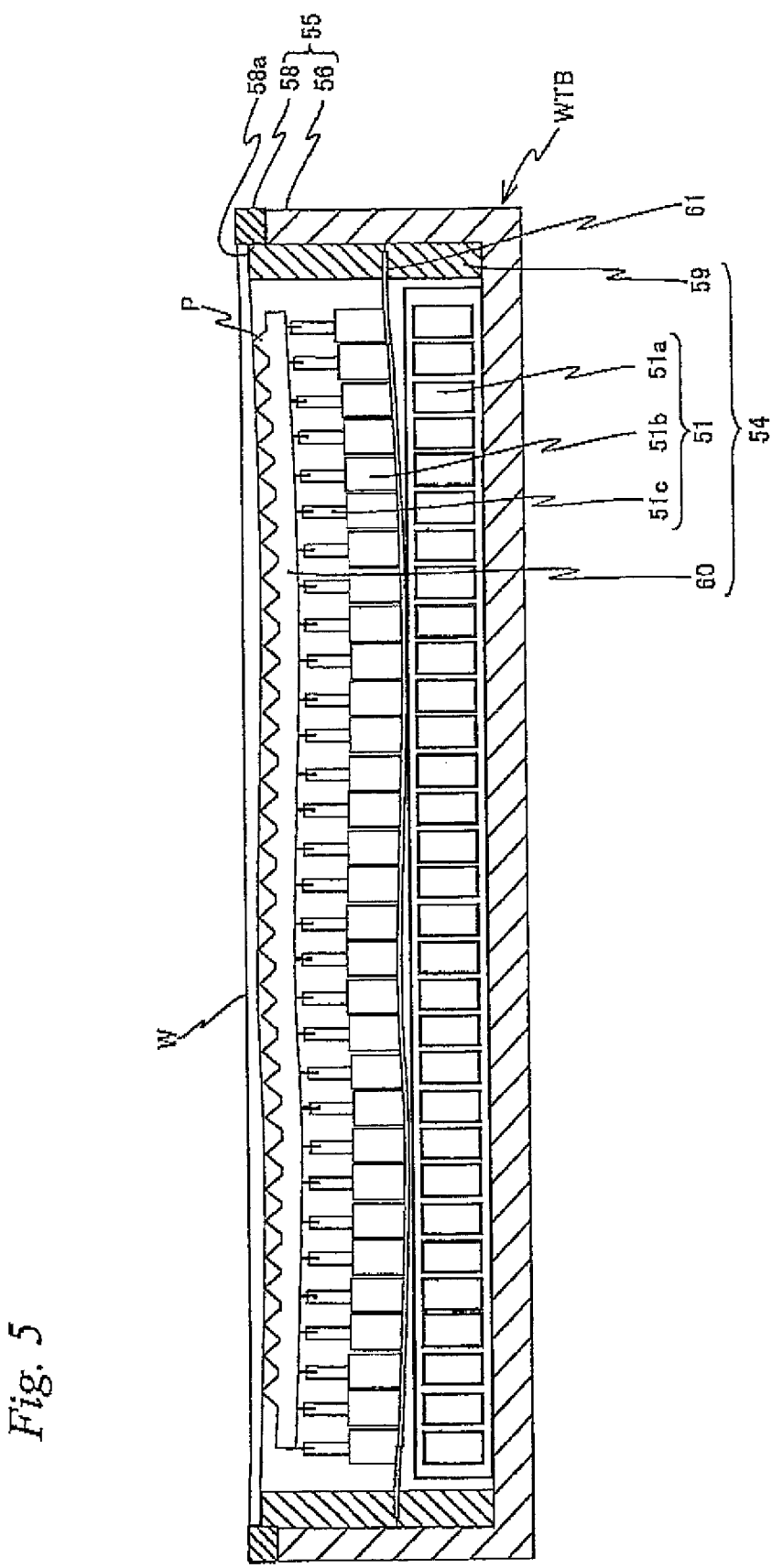
FIG. 5 is a longitudinal sectional view of a wafer table.

Wafer table WTB, as shown in FIG. 5, is equipped with a main section 55, and a wafer holding mechanism 54 which is a wafer holder that employs a type of a pin chuck method. Main section 55 has a square shape in a planar view, and is structured by a box shaped member 56 having an opening on its upper surface, and a lid member 58 which covers an area around the outer periphery of the opening. Lid member 58 has a circular opening 58a formed in the center which is in contact with a peripheral wall of a rim section to be described later on, and is made of a plate member whose outer shape is the same shape as main section 55. The height of the upper surface of lid member 58 is about the same height as wafer W held by wafer table WTB.

Wafer holding mechanism 54 has a toric rim section 59 fixed to the bottom surface of box shaped member 56 in a state almost inscribed inside four side walls (peripheral walls) of box shaped member 56, and a plurality of actuators 51 housed inside rim section 59, and a pin chuck member (table section) 60 supported from below by these plurality of actuators 51. Pin chuck member 60 has a large number of pins P formed on its upper surface by an etching process. Wafer W is suctioned by creating a vacuum in a space inside rim section 59 of wafer holding mechanism 54 via a vacuum exhausting system not shown, and its lower surface is supported by the large number of pins P. Pin chuck member 60 is made of a flexible material, or a material which deforms (bends) when a force is applied and is elastic.

Each of the plurality of actuators 51, for example, as shown in FIG. 5, has a plurality of coils 51a arranged two-dimensionally at an almost equal spacing in the inner space of rim section 59, the same number of (a plurality of) permanent magnets 51b arranged above facing each of the plurality of coils 51a, and a connecting member 51c which connects the upper end of each of the plurality of permanent magnets 51b and the rear surface (lower surface) of pin chuck member 60. The plurality of permanent magnets 51b is installed on a film member 61 which has a circular shape in a planar view whose periphery section is connected to the center in a height direction of rim section 59.

As is obvious from the description so far, actuator 51 is a kind of a voice coil motor. Actuator 51 generates a driving force which drives permanent magnet 51b (and connecting member 51c) serving as a mover in the Z-axis direction.

Here, a chuck driving system 63 shown in FIG. 11 is structured including the plurality of actuators 51, and chuck driving system 63 is connected to main controller 20. Main controller 20 drives (controls) each of the plurality of actuators 51 of chuck driving system 63 independently (separately) and by making a distribution of a force applied to the lower surface of pin chuck member 60, unevenness (flatness degree) of the surface of wafer W supported by pin chuck member 60 can be corrected.

Incidentally, in this case, the height of the upper surface of rim section 59 is almost around the same height as the upper end of pin chuck member 60, and the outer periphery section of wafer W is mounted on its upper surface. Incidentally, actuator 51 is not limited to the VCM, and for example, can also be structured by a piezoelectric element and the like.

Position information of wafer stage WST, as shown in FIG. 1, is constantly detected, for example, at a resolution of around 0.5 to 1 nm, by a wafer laser interferometer system (hereinafter referred to as a "wafer interferometer system") 18 which irradiates a measurement beam IB on a reflecting surface formed on the edge surface (side surface) of wafer table WTB by a mirror polishing process. At least a part of this wafer interferometer system 18 is supported in a suspended manner, in a state suspended from support member 38.

Figure 6:
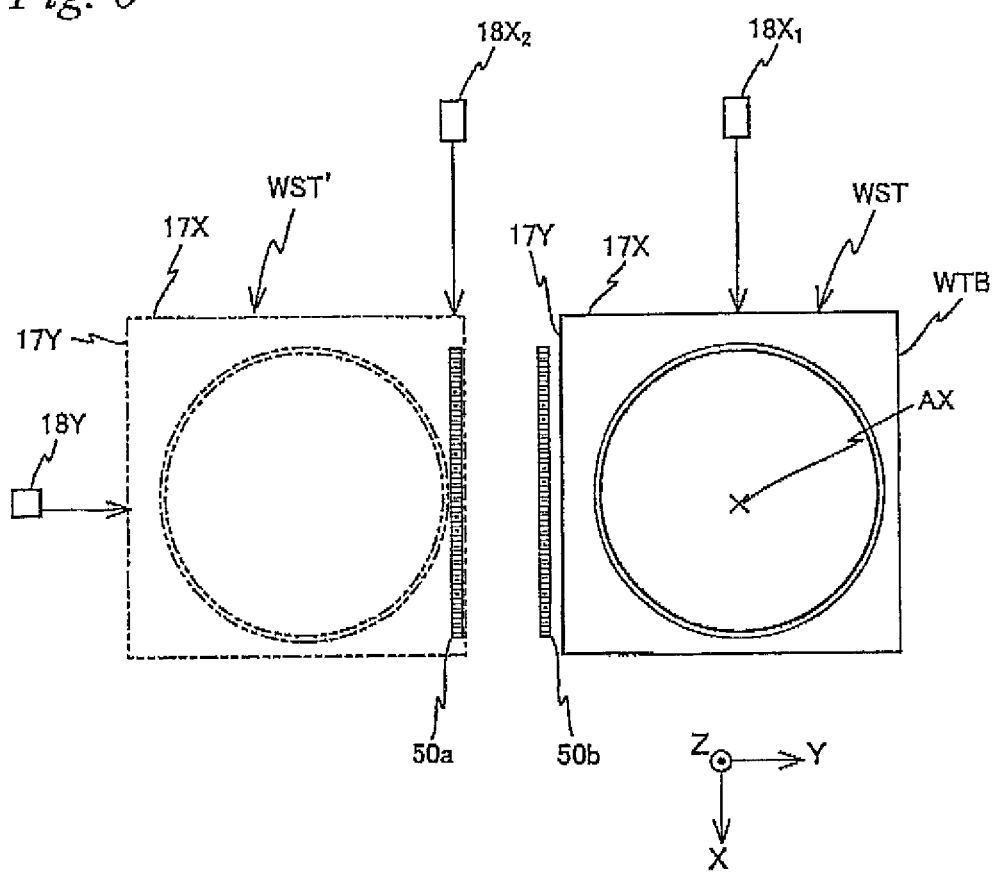
FIG. 6 is a planar view showing a placement of measurement axes of X interferometers and Y interferometers of an interferometer system, along with a wafer stage.

To described this further in detail, as shown in FIG. 6, actually, a surface on the −X side of wafer table WTB serves as a reflecting surface 17x, and a surface on the −Y side serves as a reflecting surface 17Y, and corresponding to this, laser interferometers (X laser interferometers) $18X_1$ and $18X_2$ for position measurement in the X-axis direction, and a laser interferometer (Y laser interferometer) 18Y for position measurement in the Y-axis direction are provided. Wafer stage WST, when located at a position shown by a solid line in FIG. 6 (for example, exposure position (FIG. 6 representatively shows optical axis AX of the illumination optical system)), position information within the XY plane is measured by interferometers $18X_1$ and 18Y, and when wafer stage WST is located at a position shown by a virtual line in FIG. 6 (position indicated by reference code WST', such as, for example, wafer exchange position), position information within the XY plane is measured by interferometers $18X_2$ and $18Y$. Of these interferometers, one of X interferometers ($18X_1$, $18X_2$) and Y interferometer $18Y$, such as, for example, Y interferometer $18Y$ is a multi-axis interferometer which has a plurality of measurement axes.

Further, although it is not shown in FIG. 5, wafer interferometer system 18 also is equipped with a pair of Z interferometers $18Z_1$ and $18Z_2$ (refer to FIG. 11) that are place apart in the X-axis direction. These Z interferometers $18Z_1$ and $18Z_2$ irradiate a pair of measurement beams parallel to the Y-axis on a pair of reflecting surfaces of a movable mirror having a recessed shape attached to a side surface on the −Y side of stage main section 91 (this pair of reflecting surfaces are perpendicular to the XZ plane, and are tilted symmetrically with respect to the XY plane), respectively, and irradiate the pair of measurement beams via the movable mirror, for example, on a pair of fixed mirrors (not shown), fixed to support member 38, respectively. And, Z interferometers $18Z_1$ and $18Z_2$ receive their reflected lights, and measure the optical path lengths of each measurement beam.

Measurement values of each interferometer equipped in wafer interferometer system 18 are supplied to main controller 20. Main controller 20 measures the X position of wafer stage WST based on the measurement values of X interferometers $18X_1$ and $18X_2$, and measures the Y position and also the rotation (rotation in the θz direction (yawing), and pitching (rotation in the θx direction)) of wafer stage WST, based on the measurement value of Y interferometer 18Y. Further, main controller 20 calculates the position of wafer stage WST in directions of four degrees of freedom (Y, Z, θy, and θz), based on the measurement values of Z interferometers $18Z_1$ and $18Z_2$. Details on the calculation method of the position of the wafer stage based on Z interferometers $18Z_1$ and $18Z_2$ and their measurement values are disclosed, for example, in U.S. Patent Application Publication No. 2009/0040488.

Main controller 20 can use a value obtained from the measurement value of Y interferometer 18Y and one of the values obtained from the measurement values of Z interferometers $18Z_1$ and $18Z_2$, or an average of both as the yawing (rotation in the θz direction) of wafer stage WST, when driving (performing position control of) wafer stage WST. Further, main controller 20 can also calculate the pitching (rotation in the θx direction) of wafer stage WST, using the measurement values (Y position) by Y interferometer 18Y and Z interferometers $18Z_1$ and $18Z_2$.

Incidentally, X interferometers ($18X_1$, $18X_2$) can be structured as multi-axis interferometers that can measure at least one of the yawing (rotation in the θz direction) and rolling (rotation in the θy direction) of wafer stage WST. Further, in the case yawing (rotation in the θz direction), pitching (rotation in the θx direction), and rolling (rotation in the θy direction) can be measured using reflecting surfaces 17X and 17Y, as the Z interferometer, an interferometer which performs measurement only in the Z-axis direction of wafer stage WST can be used. Incidentally, instead of using wafer interferometer system 18, or by using wafer interferometer system 18 together with an encoder system, position information of wafer stage WST can be measured in directions of six degrees of freedom.

Main controller 20 controls the position of wafer stage WST in directions of six degrees of freedom via wafer stage driving system 27, based on the position information (or velocity information) of wafer stage WST described above.

Assisting stage AST, as shown in FIG. 1, includes a stage main section 92 and a table TB fixed on stage main section 92. In between stage main section 92 of assisting stage AST and base board 71, similar to the previous description, a magnetic levitation type planar motor (27A, 27C) is structured consisting of coil array (stator) 27A and a magnet array (mover) 27C provided on a bottom surface of stage main section 92, and by the planar motor (27A, 27C), an assisting stage driving system 127 (refer to FIG. 11) is structured that can drive assisting stage AST in directions of six degrees of freedom. Assisting stage driving system 127 is controlled by main controller 20. However, assisting stage AST does not necessarily have to be drivable in directions of six degrees of freedom, and is enough being drivable in directions of three degrees of freedom within the XY plane. Position information of assisting stage AST is measured by an assisting stage interferometer 118 (omitted in FIG. 1, refer to FIG. 11).

In assisting stage AST, for example, various kinds of functional members are provided, for example, such as an aerial image measuring instrument 82 which measures an aerial image of an alignment mark formed on mask M on an image plane, a mask loading device 84 which loads mask M onto mask table MTB, an electrostatic eliminator 86 which eliminates static electricity with which mask M is charged, and a mask inspection device 88 which inspects masks for adhesion of a foreign matter and presence or absence of defects of masks (none of which are shown in FIG. 1, refer to FIG. 11) and the like.

As aerial image measuring instrument 82, an instrument having a structure similar to the one disclosed in, for example, U.S. Patent Application Publication No. 2002/0041377 and the like, can be used. Further, because mask M used in the present embodiment is a rectangular glass member whose long side is equal to or less than 100 mm, for example, a small robot arm and the like that can carry this mask M can be provided in assisting stage AST as mask loading device 84. Further, as for removal of static electricity with which mask M is charged by electrostatic eliminator 86, details are disclosed in, for example, PCT International Publication No. WO 2002/041375. As mask inspection device 88, for example, a device can be used that irradiates a small spot-shaped laser beam on mask M, receives the reflected light, and judges from the light whether or not a subject on mask M is a pattern which is supposed to be there or is a foreign matter.

Figure 7:
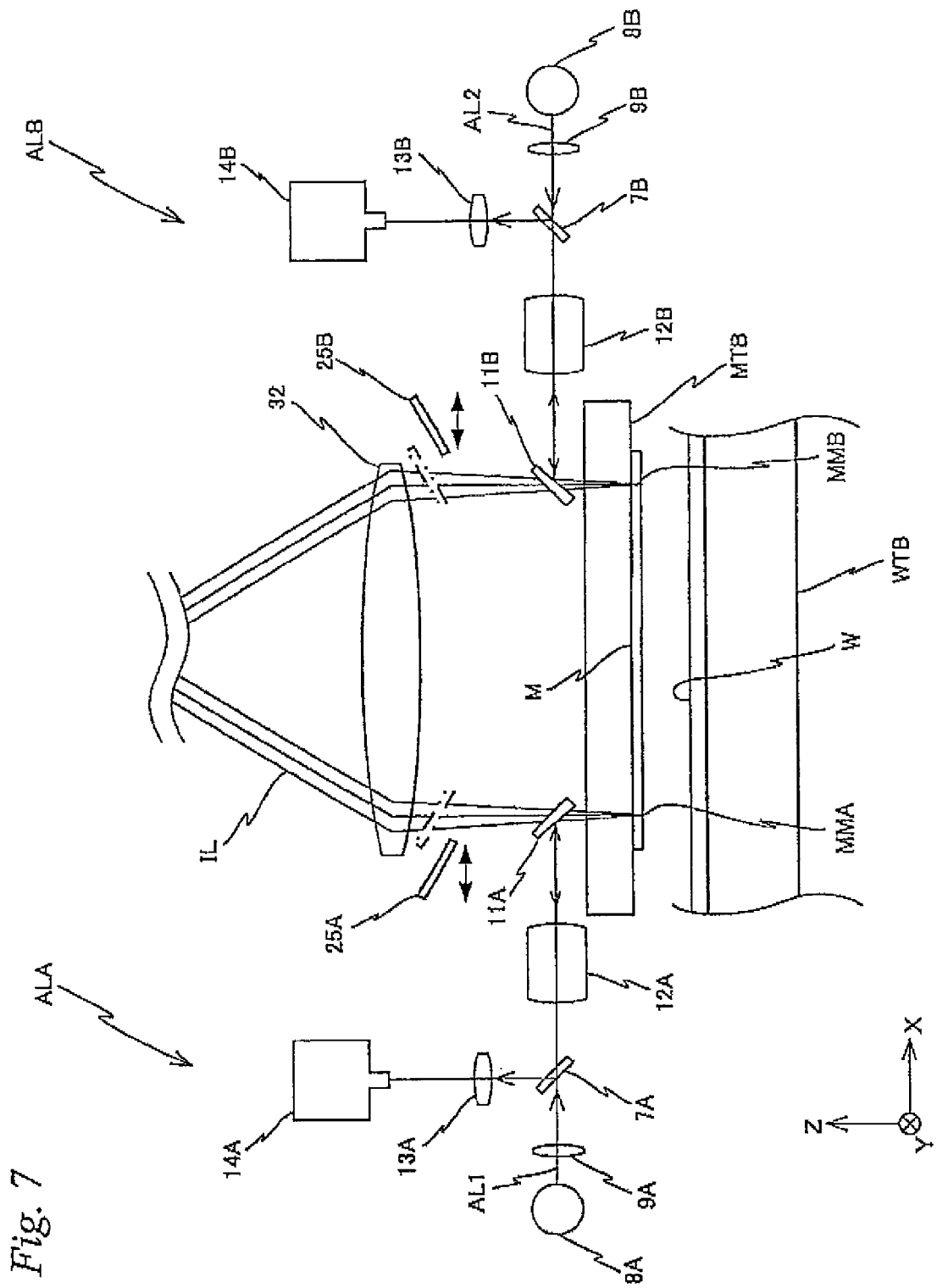
FIG. 7 is a view showing an example of a structure of an alignment device.

On both ends in the X-axis direction of pattern area PA of mask M, as shown in FIG. 7, alignment mark MMA and alignment mark MMB used for position setting that mutually make a pair are formed in a plurality of pairs, along the Y-axis direction at a predetermined spacing.

Above mask table MTB, in the vicinity above each of the plurality of pairs of alignment mark MMA and alignment mark MMB of mask M, alignment system ALA and alignment system ALB are provided, respectively, to perform position setting (alignment) of mask M, or to perform alignment mutually of mask M and wafer W.

One alignment system ALA on the −X side, as shown in FIG. 7, includes a dichroic mirror 11A which is placed at a position slightly on the outer side on the −X side of the pattern area mask M (alignment mark MMA is formed at this position on the pattern surface of mask M) above mask table MTB, tilted by an angle of 45 degrees with respect to each of the XY plane and the YZ plane, and a first object lens 12A and the like placed on the −X side of dichroic mirror 11A. Dichroic mirror 11A transmits exposure beam IL having passed through collimator lens 32, and an alignment light to be described later on has reflection wavelength selectivity.

Alignment system ALA, furthermore, is equipped with a light source 8A used for alignment, an illumination relay lens 9A, a half mirror 7A, a second object lens 13A, and an imaging device 14A and the like. As light source 8A used for alignment, for example, a halogen lamp, an LED, or an He—Ne laser light source and the like can be used that generates a non-photosensitive alignment light (for example, light having a wavelength of 500 nm or more) to the photoresist on wafer W whose wavelength band differs from that of exposure beam IL.

In alignment system ALA, at the time of alignment, an alignment light AL1 emitted from light source 8A is irradiated on alignment mark MMA of mask M and on wafer W, via illumination relay lens 9A, half mirror 7A, the first object lens 12A and dichroic mirror 11A.

Reflected light (including reflected light from an alignment mark on wafer W in the case there is an alignment mark on wafer W) from alignment mark MMA forms an image of alignment mark MMA (and the alignment mark on wafer W) on an imaging plane of imaging device 14A, via dichroic mirror 11A, the first object lens 12A, half mirror 7A, and the second object lens 13A.

One alignment system ALB on the +X side includes a light source 8B, an illumination relay lens 9B, a half mirror 7B, a dichroic mirror 11B, a first object lens 12B, a second object lens 13B, and an imaging device 14B, and is structured in a similar manner as alignment system ALA described above, except for being symmetrical. According to alignment light AL2 from light source 8B, an image of alignment mark MMB (furthermore, in some cases, the alignment mark on wafer W) on mask M is formed on an imaging plane of imaging device 14B.

Figure 8:
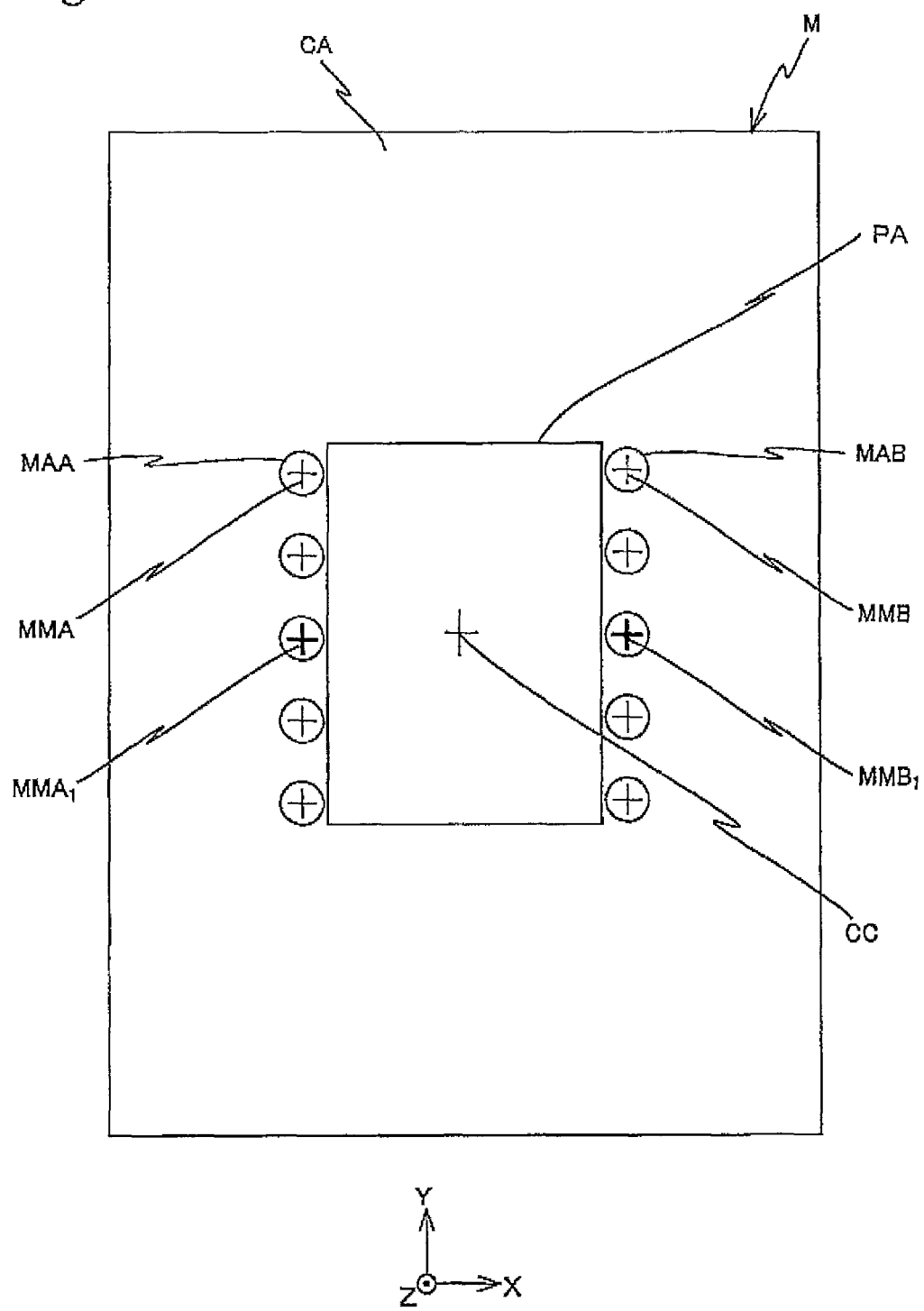
FIG. 8 is a view used to describe detection areas of a plurality of pairs of alignment systems.

Placement of detection areas MAA and MAB of the plurality of pairs of alignment system ALA and alignment system ALB is set, as shown in FIG. 8, corresponding to the placement of alignment mark MMA and alignment mark MMB on mask M. On mask M, as shown in FIG. 8, a pair of alignment marks (hereinafter, appropriately described as alignment mark MMA1 and alignment mark MMB1 for the sake of convenience) is formed at positions equally distanced to the −X side and to the +X side from the center of pattern area PA of mask M, or in other words, from mask center CC, and on the +Y side and the −Y side of the pair of alignment mark MMA1 and alignment mark MMB1, a plurality of pairs, such as, for example, two pairs of alignment mark MMA and alignment mark MMB are placed equally distanced apart. Detection signals from the plurality of pairs of alignment system ALA and alignment system ALB are supplied to main controller 20 (refer to FIG. 11).

Between each of dichroic mirrors 11A and 11B of the plurality of pairs of alignment system ALA and alignment system ALB and collimator lens 32, shutters 25A and 25B are placed that open and close optical paths of exposure beam IL leading to dichroic mirrors 11A and 11B via collimator lens 32. The open and close of shutters 25A and 25B are performed by main controller 20 (refer to FIG. 11). That is, after alignment of mask M which will be described later on, in the case alignment mark MMA and alignment mark MMB on mask M also have to be transferred onto wafer W along with the pattern of mask M, main controller 20 performs exposure by a proximity method in a manner which will be described later on, in a state where shutters 25A and 25B are open. Meanwhile, after alignment of mask M, in the case only the pattern of mask M has to be transferred on wafer W (in the case alignment mark MMA and alignment mark MMB on mask M are not transferred), main controller 20 closes shutters 25A and 25B, and in this state, performs exposure by a proximity method in a manner which will be described later on using mask M. In the manner described above, shutters 25A and 25B are used to easily switch between transfer and non-transfer of the alignment mark of mask M onto wafer W, by opening and closing of the shutters.

Figure 9:
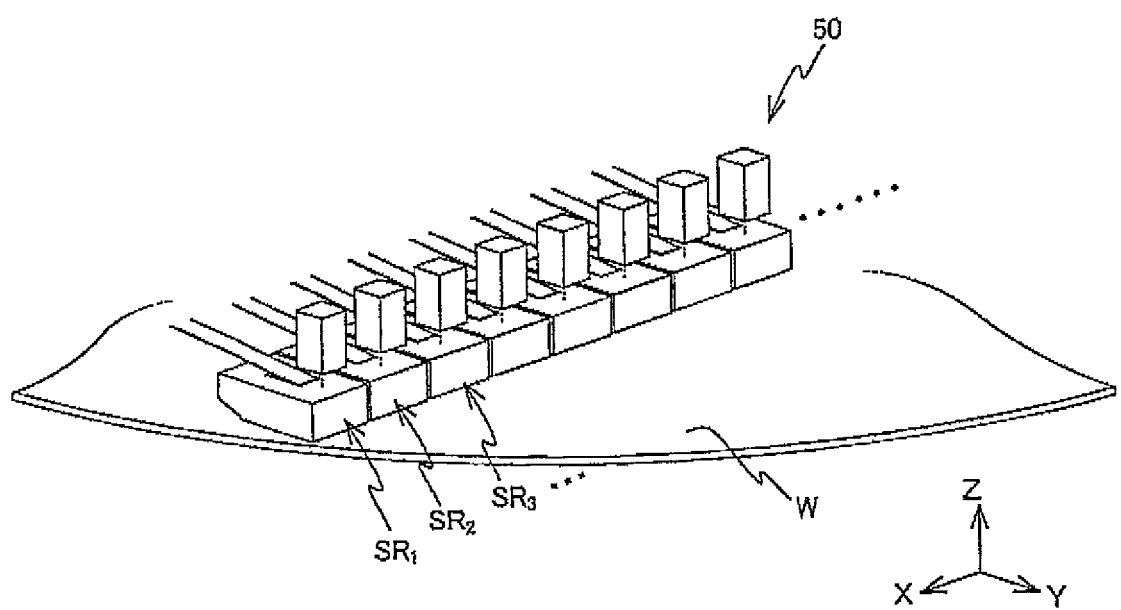
FIG. 9 is a perspective view schematically showing a structure of a substrate surface information measurement device.

In the present embodiment, furthermore, on a lower surface of support member 38 of body BD, as shown in FIG. 1, at a position a predetermined distance away in the −Y direction from the exposure position, a pair of substrate surface information measurement devices (hereinafter, shortly referred to as a surface information measurement device) 50$a$ and 50$b$ is installed by a predetermined spacing in the Y-axis direction. Surface information measurement devices 50$a$ and 50$b$, as shown in FIG. 9 which representatively shows surface information measurement device 50$a$ in a perspective view, include a large number of sensor modules (sensor units or sensor mechanisms) $SR_1$, $SR_2$, $SR_3$, . . . , $SR_n$ arranged along the X-axis direction.

Figure 10A:
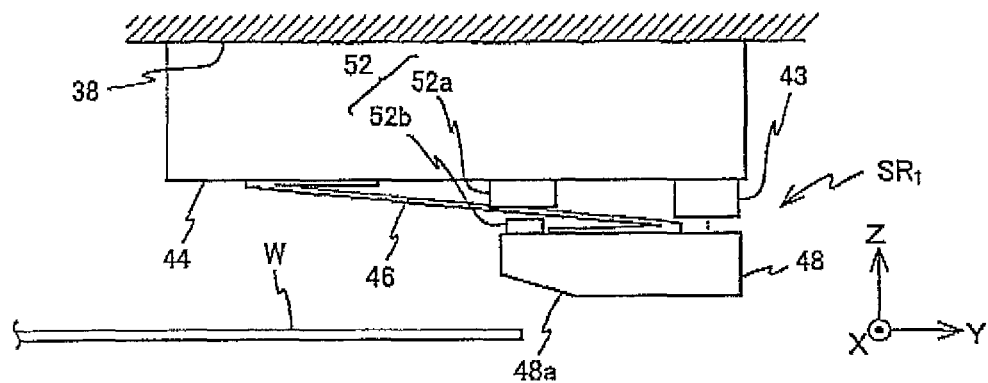
FIGS. 10A to 10C are views used to describe a structure of the substrate surface information measurement device, along with its measurement mechanism.

Each of these sensor modules $SR_1$, $SR_2$, $SR_3$, . . . , $SR_n$, as it can be seen from FIG. 10A which representatively shows one sensor module SR1, include a base 44 fixed to the lower surface of support member 38, a plate spring 46 whose upper und is fixed to a lower surface of base 44 and having a rough inverted Z shape when viewed from the +X direction to the −X direction, a levitated body 48 fixed to a lower end of plate spring 46, and a capacitance sensor 43 provided on the lower surface of base 44 facing the upper surface of levitated body 48 that measures a gap formed with the upper surface of levitated body 48.

Furthermore, sensor module SR1 includes a holding mechanism 52 used for holding levitated body 48 at a predetermined height (a predetermined Z position). This holding mechanism 52 includes an electromagnet (solenoid) 52$a$ including a coil fixed to the lower surface of base 44, and a magnetic body member 52$b$ fixed to the upper surface of levitated body 48 at a position facing electromagnet 52$a$ in the Z-axis direction. According to this holding mechanism 52, when electric current is supplied to the coil structuring electromagnet 52$a$, as shown in FIG. 10A, a magnetic suction force is generated between electromagnet 52$a$ and magnetic body member 52$b$ so that levitated body 48 is held at a predetermined height, whereas, when the supply of electric current to the coil structuring electromagnet 52$a$ is stopped, as shown in FIG. 10B, the magnetic suction force (holding force that holds levitated body 48) is released, and levitated body 48 moves downward (−Z direction) by its own weight (declines).

Figure 10B:
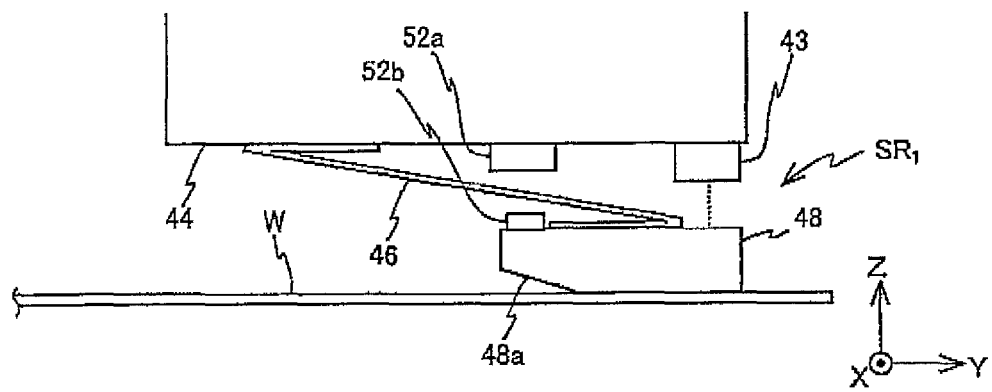
Figure 10C:
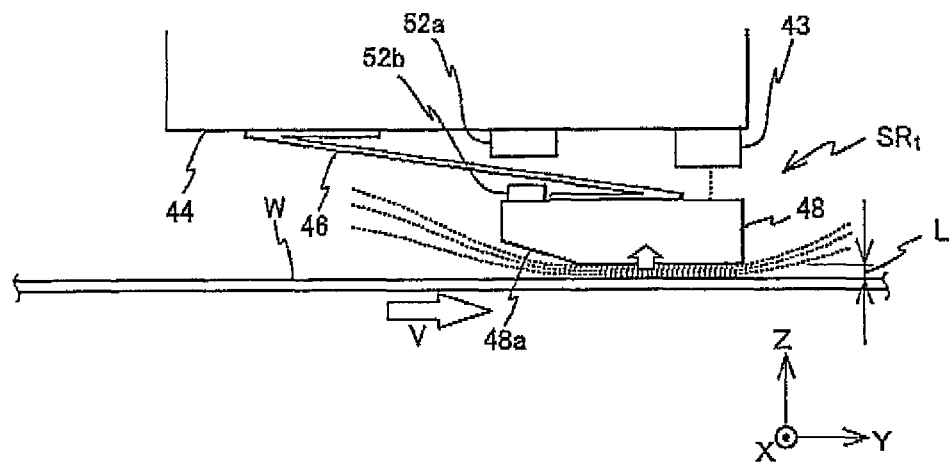

Levitated body 48 is structured, for example, from stainless and the like, and in a state in contact with the surface of wafer W as shown in FIG. 10B, when wafer W moves at a constant velocity (referred to as velocity V), levitated body 48 is levitated by a predetermined distance (referred to as distance L) by a dynamic pressure of an airflow generated by the movement of wafer W, as shown in FIG. 10C. Incidentally, a chamfered section 48$a$ is provided on a lower surface (−Z side surface) of levitated body 48 on the −Y side end, which makes it easier to form an airflow between the upper surface of wafer W and the lower surface of levitated body 48.

According to sensor module SR1 structured in the manner described so far, when wafer W moves in a predetermined velocity, levitated body 48 is levitated by a distance corresponding to the velocity, therefore, by maintaining the velocity, for example, to velocity V, the distance between wafer W and levitated body 48 can be maintained constant (distance L). Accordingly, because height position (Z-axis direction position) of levitated body 48 changes according to the unevenness of the surface of the wafer, by measuring the position of the upper surface of levitated body 48 using capacitance sensor 43, position information of the surface of wafer W can be substantially measured.

Referring back to FIG. 9, other sensor modules $SR_2$, $SR_3$, ... $SR_n$ are also structured in a similar manner as sensor module SR1 described above. Hereinafter, for the sake of convenience, in the case sensor modules $SR_2$, $SR_3$, ... $SR_n$ are used in the description below, the same reference codes as the reference codes described above will be used in the explanation. Incidentally, in the case the width in the X-axis direction of levitated body 48 of each sensor module $SR_i$ (i=1 to n) is, for example, 5 mm, and wafer W has a diameter of 300 mm, then about 60 sensor modules will be arranged along the X-axis direction, or in other words, n=60.

Surface information measurement device 50b is structured in a similar manner as surface information measurement device 50a, although it is placed at a different position. While the Y position of surface information measurement device 50a is set substantially coinciding with the measurement axis of X interferometer $18X_2$ as shown in FIG. 6, surface information measurement device 50b is placed at a position to the +Y side from this position of by a predetermined distance.

Usage and the like of surface information measurement devices 50a and 50b of the present embodiment structured in the manner described above will be described, later in the description.

Furthermore, in the present embodiment, also on wafer stage WST, a mask surface information measurement device 50c structured in a similar manner as surface information measurement devices 50a and 50b is provided, as shown in FIG. 1 and FIG. 11. Mask surface information measurement device 50c is fixed to the +Y side end of wafer table WTB, and is used to measure surface information (unevenness information) of mask M when wafer stage WST moves in the Y-axis direction.

FIG. 11 shows a block diagram of an input-output relation of main controller 20 which mainly structures a control system of exposure apparatus 100 in the present embodiment. Main controller 20 includes a so-called microcomputer (or workstation) consisting of a CPU (Central Processing Unit), ROM (Read Only Memory), RAM (Random Access Memory) and the like, and has overall control over the entire apparatus.

Next, a series of operations of exposure apparatus 100 of the present embodiment structured in the manner described above will be described, however, prior to this, exposure using near-field light employed in the present embodiment (hereinafter appropriately referred to as a near-field light exposure), and silylation (silylation) in which adhesion of silicon (Si) in the vicinity of a surface of a photosensitive section of a predetermined resist is performed in a process of developing a resist on a plurality of layers on the wafer will be described. In the present embodiment, silylation is used to improve tolerance of the photosensitive section of the predetermined resist to the developing fluid. Silylation for such a purpose is described in detail, for example, in PCT International Publication No. WO 2010/030018 (corresponding U.S. Patent Application Publication No. 2010/0068660).

FIGS. 12A to 12E used in the description below are enlarged sectional views of a part of the wafer W surface which is going through a series of processes in pattern forming. Incidentally, in FIG. 12B mask M is illustrated together with wafer W. Further, a line-and-space pattern (L/S pattern) is formed on wafer W as an example, and the X-axis direction serves as a periodic direction of the L/S pattern, and the Z-axis direction serves as a normal direction of the wafer W surface.

Figure 12A:
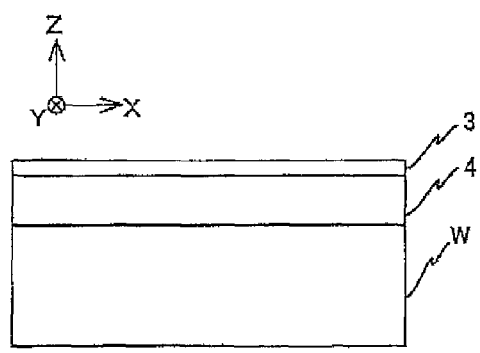
FIG. 12A to FIG. 12E are views used to describe a series of pattern forming processes.

First of all, using a thin-film deposition device which is not shown, a thin film (not shown) for pattern forming is formed on the surface of wafer W made of a semiconductor wafer. Next, wafer W is carried to a coater/developer which is not shown, and as shown in FIG. 12A, a normal positive resist 4 which is not turned into silyl is coated on the wafer W surface to a predetermined thickness (for example, around 0 to 200 nm). Subsequently, a negative resist (negative type silylation resist) 3 having low sensitivity (a large necessary exposure amount) and also having silylating properties is coated on positive resist 4 to a predetermined thickness (for example, around 10 nm). Incidentally, after having coated positive resist 4 on wafer W, and/or having further coated negative resist 3, prebake of wafer W can be performed when necessary.

Figure 12B:
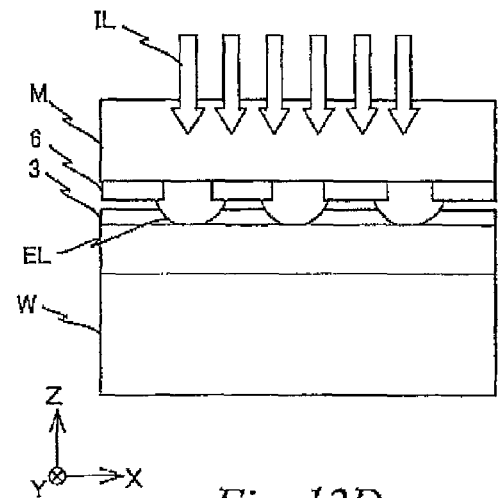
Figure 12C:
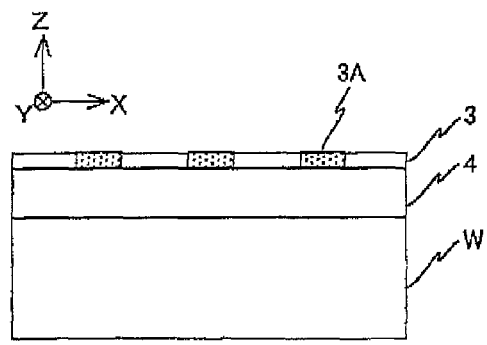

Next, wafer W on which two layers of resists (3, 4) are coated is carried onto wafer stage WST of exposure apparatus 100, and the L/S pattern of mask M is exposed and transferred onto each shot area of wafer W using a near-field light. In the case, as shown in FIG. 12B, exposure beam IL is irradiated on mask M, and a near-field light EL leaks out from the aperture section (L/S pattern) formed in a light-shielding film 6 of the pattern area of mask M, and negative resist 3 on wafer W is exposed by near-field light EL. As a consequence, as shown in FIG. 12C, only the part of negative resist 3 facing the aperture section becomes a photosensitive section 3A.

Next, wafer W after exposure is carried from exposure apparatus 100 to the coater/developer, and PEB (post-exposure bake) which is baking before development to wafer W is performed as necessary, to reduce standing wave effect.

Figure 12D:
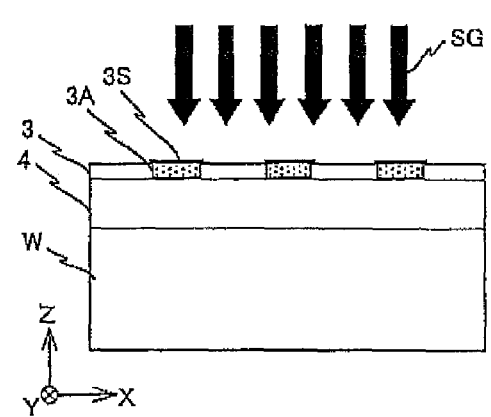

Next, in order to silylate photosensitive section 3A of negative resist 3 on wafer W, as shown in FIG. 12D, silylating gas SG such as, for example, HMDS (Hexamethyldisilizane: Hexamethyldisilizane) containing silicon (Si) can be applied to the surface of negative resist 3 and positive resist 4 of wafer W at a temperature of around 150° C., so as to heat wafer W. As a consequence, as shown in FIG. 12D, a silylation section 3S is formed on which a material including high etching resistance silicon is adherent to only the surface of photosensitive section 3A of negative resist 3.

Figure 12E:
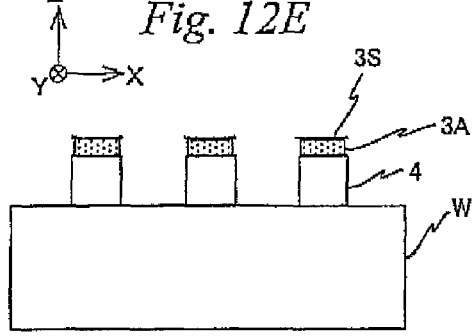

Next, as shown in FIG. 12E, development (etching) is performed on negative resist 3 and positive resist 4 on wafer W, to gradually remove material from parts other than photosensitive section 3A. Because this process is performed by sputtering liquid (hereinafter called dissolving liquid) which dissolves negative resist 3 (part which is not silylated) and positive resist 4, it can also be referred to as dry development or etching (etching which removes both the negative resist and the positive resist) of a resist.

That is, from a nozzle (not shown) located above wafer W, the dissolving liquid is sputtered downward (−Z direction) to wafer W for a predetermined period of time. In this case, because silylation section 3S is formed on the surface of photosensitive section 3A of negative resist 3, photosensitive section 3A remains without fail. This dry development is stopped at the point where the part in between photosensitive section 3A of negative resist 3 (non-photosensitive section of negative resist 3 and positive resist 4 below) is removed completely by the dry development, as shown in FIG. 12E. On wafer W, a negative type resist pattern leveled by positive resist 4 remains.

Incidentally, to increase tolerance of photosensitive section 3A of negative resist 3 to the developing fluid, a process other than silylation can also be used.

Further, in the present embodiment, as the development, dry development is performed which is etching that acts on both the positive resist and the negative resist. Instead of this, a development can be performed which acts only on negative resist 3 (anisotropic dry development in which development liquid in a plasma state is sputtered). In this case, because the non-photosensitive section of positive resist 4 remains after development, it is preferable to execute a process of stripping only the non-photosensitive section.

Incidentally, the series of processes (process) in pattern forming described above is an example, and other than such special processes, other processes can also be employed, such as, for example, a normal (conventional) process in which the resist does not have to be silylated.

Further, in the present embodiment, while a one-dimensional L/S pattern is transferred on wafer W, a two-dimensional L/S pattern having periodicity in the X direction and Y direction can also be transferred on wafer W. In this case, conclusively, a two-dimensional fine pattern can be formed on wafer W.

Next, a series of operations performed by exposure apparatus 100 of the present embodiment will be described.

Figure 13A:
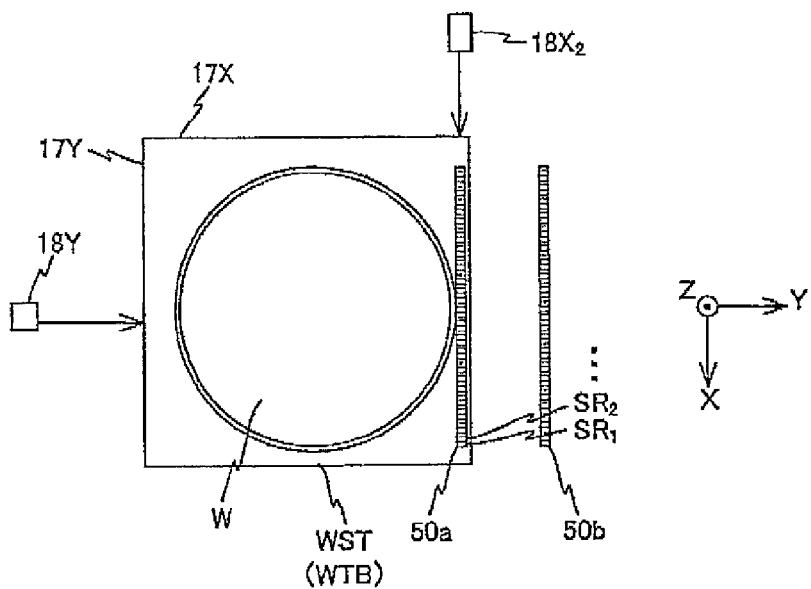
FIG. 13A to FIG. 13C are views (No. 1) used to describe measurement of wafer surface information and flatness correction using the substrate surface information measurement device.

FIG. 13A shows a state where exposure to a wafer mounted on wafer table WTB is completed, and wafer table WTB is aligned at a wafer exchange position (in the present embodiment, a position where the wafer which has been exposed is unloaded from wafer table WTB, and wafer W subject to the next exposure is loaded onto wafer table WTB) with a new wafer W loaded thereon. In this state, as it can be seen in FIG. 13A, wafer W and levitated body 48 structuring each sensor module $SR_i$ (i=1 to n) of surface information measurement device 50a are not facing each other. At this point, levitated body 48 structuring each sensor module $SR_i$ (i=1 to n) of surface information measurement device 50a faces the upper surface of wafer table WTB. In this state, electric current is supplied to electromagnet 52a (coil) of holding mechanism 52 of each sensor module $SR_i$, and the height of levitated body 48 of each sensor module $SR_i$ is set to the height shown in FIG. 10A. Incidentally, in this case, while the unloading and the loading of the wafer are performed at the wafer exchange position, besides this, the position where the wafer which has been exposed is unloaded from wafer table WTB and the position to load wafer W subject to the next exposure onto wafer table WTB can be different.

Further, at this point, levitated body 48 structuring each sensor module $SR_i$ (i=1 to n) of surface information measurement device 50b does not face wafer W (and wafer table WTB) as well, and the height of levitated body 48 of each sensor module $SR_i$ of surface information measurement device 50b is set to the height shown in FIG. 10A.

Incidentally, because surface information measurement devices 50a and 50b detect measurement errors between each of the sensor modules prior to the measurement of surface information of wafer W, for example, a substrate (a super flat wafer and the like) whose flatness has been secured can be mounted on wafer table WTB, and calibration between each of the capacitance sensors can be performed, using measurement results of the substrate according to each of surface information measurement devices 50a and 50b. At this point, for example, the substrate used for calibration can be set parallel to the XY plane prior to the measurement, or the measurement results can be corrected, using tilt information (rotation in the θx direction, rotation in the θy direction) of wafer table WTB according to wafer interferometer system 18. Further, the measurement values (Z position information) of wafer interferometer system 18 are made to correspond to the measurement values of each sensor module.

Main controller 20, from this state, drives wafer stage WST at a constant speed in the +Y direction at a predetermined velocity V by wafer stage driving system 27, based on measurement results of interferometers $18X_2$ and $18Y$. Then, in a state where wafer W faces levitated body 48 of a part of the sensor modules of surface information measurement device 50a (in FIG. 13B, of the plurality of sensor modules, the sensor modules facing wafer W are blackened), main controller 20 releases the magnetic suction force (holding force) of holding mechanism 52 structuring the part of the sensor modules. Incidentally, while the holding of levitated body 48 by holding mechanism 52 is released when a plurality of levitated bodies 48 face wafer W in this case, the present invention is not limited to this, and the holding can be released sequentially when levitated body 48 faces wafer W. Further, for example, in the case wafer W is mounted on wafer table WTB so that the surface of wafer table WTB almost coincides with the surface of wafer W, the holding of all of the levitated bodies can be released at once or the holding can be release sequentially from the levitated bodies placed around the center, after wafer W faces wafer table WTB. In this case, the holding of levitated body 48 can be released at the point when levitated body 48 faces wafer W, or the holding can be released just before this point.

By releasing the holding force in the manner described above, while levitated body 48 of the sensor modules moves to shift from the state shown in FIG. 10A to the state shown in FIG. 10B due to its own weight, because wafer W is already moving in a constant speed at the predetermined velocity V, a state where levitated body 48 is levitated by only predetermined distance L with respect to wafer W is maintained, due to a dynamic pressure of an airflow generated between the lower surface of levitated body 48 and the wafer W upper surface (refer to FIG. 10C).

Figure 13B:
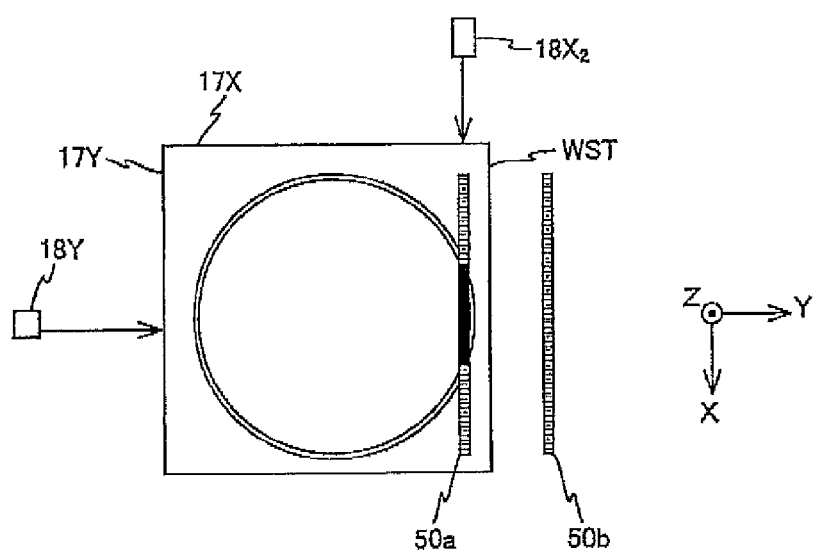

Main controller 20 detects the gap between the upper surface of levitated body 48 and capacitance sensor 43, using the blackened sensor modules in FIG. 13B. Then, main controller 20 performs mapping of the detection results, making the detection results (surface information of wafer W (Z position (surface position) information of the wafer W surface at each detection point)) correspond to the values of interferometers $18X_2$ and $18Y$. Here, measurement results of capacitance sensor 43 may be affected by the position in the Z-axis direction and the posture (rolling and pitching) of wafer stage WST. Therefore, in the present embodiment, each measurement result is corrected based on the measurement values of wafer interferometer system 18 at the time of the measurement. In other words, variation factors which fluctuates the measurement results of capacitance sensor 43 are taken into consideration, when distribution of the Z position information of the wafer surface is measured. It is the same hereinafter.

Meanwhile, in the state shown in FIG. 13B, levitated body 48 structuring each sensor module $SR_i$ (i=1 to n) of surface information measurement device 50b does not face wafer W, nor is it about to face wafer W.

After the mapping begins, main controller 20 begins a correction operation of unevenness (flatness) of the surface of wafer W for sections where mapping has been completed via chuck driving system 63, based on the mapping results (measurement results according to surface information measurement device 50a), concurrently while wafer stage WST moves in the +Y direction.

Figure 13C:
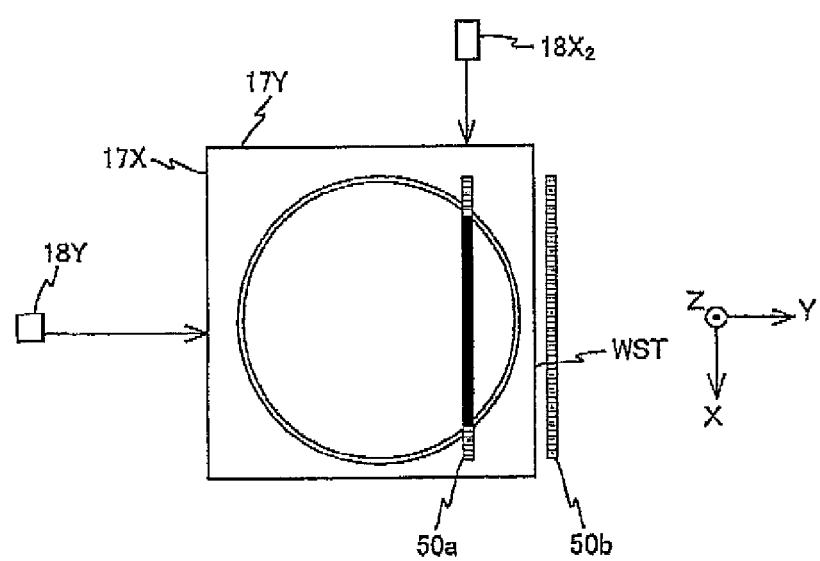

Then, as shown in FIG. 13C, because sensor modules of surface information measurement device 50a facing wafer W increases with wafer stage WST moving in the +Y direction, main controller 20 releases the holding force of holding mechanism 52 of the sensors that face wafer W. Incidentally, during this operation, measurement using each sensor module, and the correction operation of the unevenness (flatness) of the surface of wafer W based on the measurement results (mapping results of the surface information of wafer W) are still being performed at a predetermined sampling interval.

Figure 14:
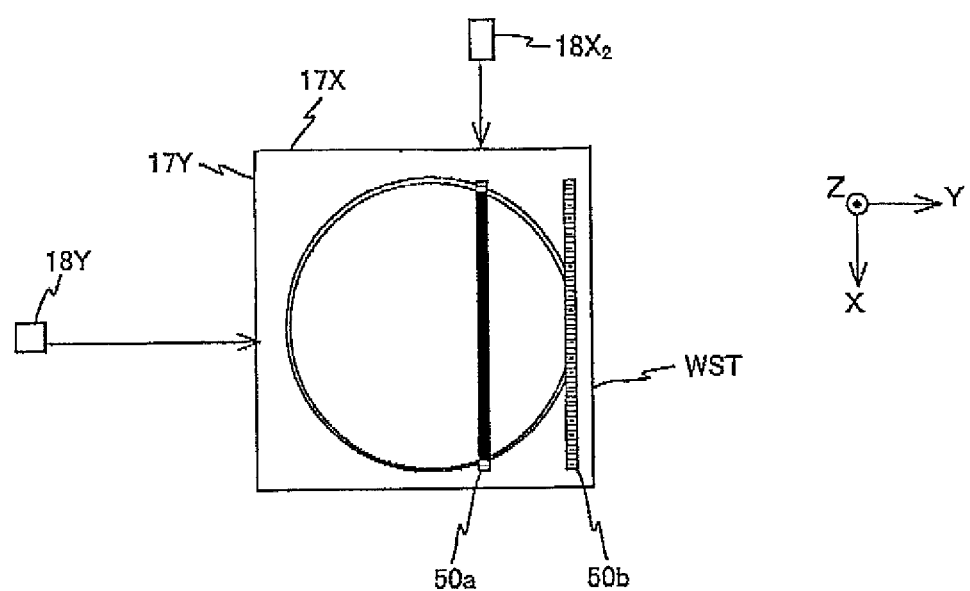
FIG. 14 is a view (No. 2) used to describe measurement of wafer surface information and flatness correction using the substrate surface information measurement device.

When wafer stage WST moves in the +Y direction to the position shown in FIG. 14 in the manner described above, levitated body 48 structuring a part of the sensor modules of surface information measurement device 50b comes to face wafer W. Therefore, main controller 20 releases the holding of levitated body 48 at the point when levitated body 48 faces wafer W, or slightly before the point, and begins measurement of the surface information of wafer W by surface information measurement device 50b, or in other words, begins an operation of confirming the correction results of the unevenness (flatness) of the surface of wafer W. And, if a part whose flatness is not corrected is found by the confirming operation, main controller 20 immediately performs correction again of the unevenness (flatness) of the surface of wafer W for that part.

Figure 15A:
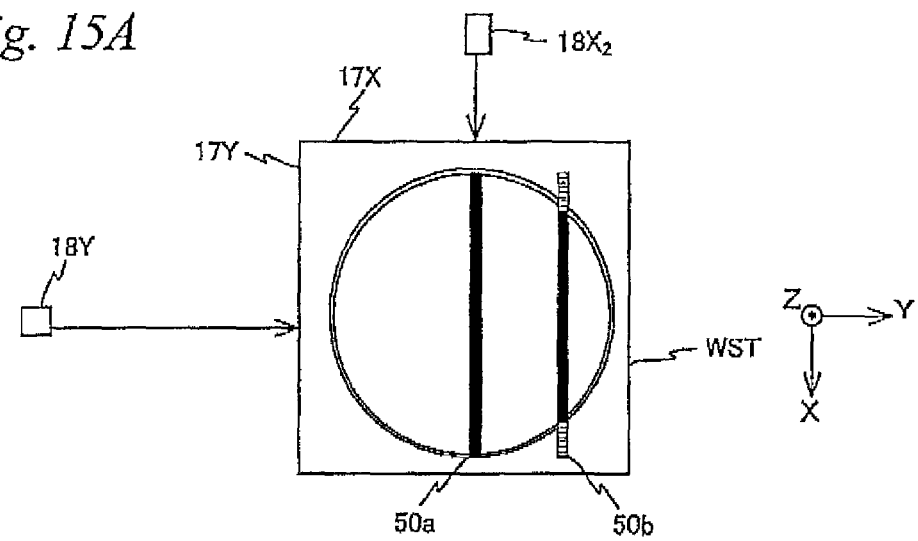
FIGS. 15A to 15C are views (No. 3) used to describe measurement of wafer surface information and flatness correction using the substrate surface information measurement device.

In the manner described above, while wafer stage WST moves to the position shown in FIG. 15A, main controller 20 performs the mapping of the surface information of wafer W while increasing the sensor modules of surface information measurement device 50a used for measuring the surface information of wafer W, the correction operation of the unevenness (flatness) of the surface of wafer W based on the mapping results, and the confirming operation (and the correction operation again of the unevenness (flatness) of the surface of wafer W as necessary) of the correction results of the unevenness (flatness) of the surface of wafer W, using surface information measurement device 50b.

Figure 15B:
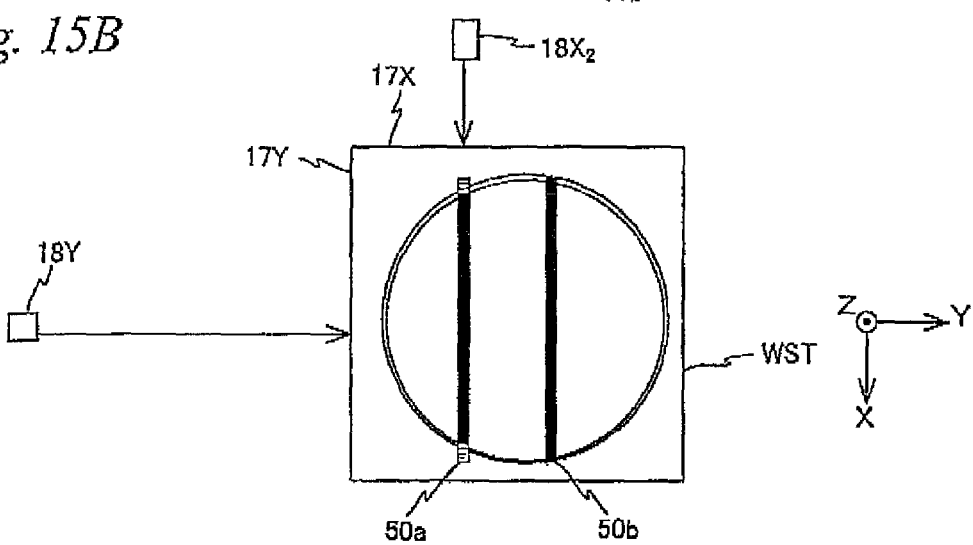
Figure 15C:
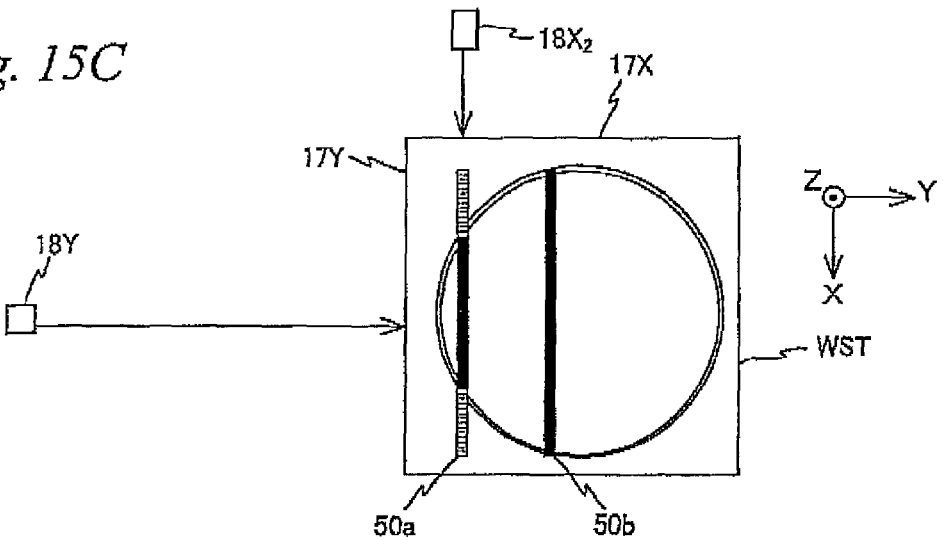

And, from the state shown in FIG. 15A onward, sensor modules of surface information measurement device 50a that do not face wafer W gradually increase, as shown in FIGS. 15B and 15C. Therefore, from the state shown in FIG. 15A onward, main controller 20 performs mapping of the surface information of wafer W while decreasing the sensor modules of surface information measurement device 50a used for measuring the surface information of wafer W, the correction operation of the unevenness (flatness) of the surface of wafer W based on the mapping results, and the confirming operation (and the correction operation again of the unevenness (flatness) of the surface of wafer W as necessary) of the correction results of the unevenness (flatness) of the surface of wafer W, using surface information measurement device 50b. In this case, main controller 20 begins to supply electric current to holding mechanism 52 (the coil of electromagnet 52a) of the sensor modules of surface information measurement device 50a that no longer face wafer W (or the sensor modules just before the sensor modules no longer face wafer W), so as to hold levitated body 48 structuring the sensor modules at a predetermined height (the height shown in FIG. 10A).

In the manner described above, the measurement (mapping) of the surface information of almost the entire surface of wafer W, the correction operation of the unevenness (flatness) of the surface of wafer W based on the mapping results, and the confirming operation (and the correction operation again of the unevenness (flatness) of the surface of wafer W as necessary) of the correction results of the unevenness (flatness) of the surface of wafer W, using surface information measurement device 50b. Incidentally, in the description above, while the increase and the decrease of the sensor modules of surface information measurement device 50a used for measuring the surface information of wafer W and the stopping and the starting (switching the position of levitated body 48 in the height direction) of supply of electric current to holding mechanism 52 structuring the sensor modules that accompany the increase and the decrease were described, as for surface information measurement device 50b as well, increase and the decrease of the sensor modules used for measuring the surface information of wafer W and the stopping and the starting (switching the position of levitated body 48 in the height direction) of supply of electric current to holding mechanism 52 structuring the sensor modules that accompany the increase and the decrease are performed in a manner similar to the description above.

Following the measurement (mapping) of the surface information of wafer W, the correction operation of the unevenness (flatness) of the surface of wafer W based on the mapping results, and the confirming operation of the correction results of the unevenness (flatness) of the surface of wafer W, using surface information measurement device 50b, main controller 20 moves wafer stage WST further in the +Y direction until it reaches the exposure position.

In this case, because the measurement beam from interferometer 18$X_2$ no longer hits the reflecting surface of wafer table WTB at a predetermined point which is after the measurement (mapping) of the surface information of almost the entire surface of wafer W has been completed and is also before the confirming operation of the correction results of the unevenness (flatness) of the surface of wafer W, using surface information measurement device 50b is completed, main controller 20 performs a linking operation of the interferometers in a state where the measurement beams of interferometer 18$X_2$ and interferometer 18$X_1$ are simultaneously hitting reflecting surface of wafer table WTB.

In the present embodiment, when wafer stage WST moves in the +Y direction for the measurement (mapping) of the surface information of wafer W as described above, main controller 20 performs measurement of surface information (unevenness information) of mask M using mask surface information measurement device 50c, prior to the beginning of the measurement (mapping) of the surface information. Measurement results of the surface information (unevenness information) of mask M are stored in memory which is not shown by main controller 20.

While the measurement of the surface information (unevenness information) of mask M is performed in a manner similar to the measurement of the surface information of wafer W described above, the point in which electromagnets that the plurality of sensor modules of mask surface information measurement device 50c have generate a magnetic repulsive force to support the self weight of the levitated body at the time of measurement is different. Incidentally, the measurement of the surface information (unevenness information) of mask M can be performed when wafer stage WST returns to a loading position.

In succession to wafer stage WST moving in the +Y direction described above, main controller 20 positions wafer stage WST to a position where the first shot area is positioned almost directly below mask M so as to perform exposure of the first shot area on wafer W. Here, the pattern of mask M is to be transferred overlaying the pattern onto a pattern that is already formed in a plurality of shot areas on wafer W. In this case, main controller 20 sets the position of mask M in the procedure described earlier, using the pair of alignment system ALA and alignment system ALB and plane VCM 65, and also sets the position (alignment) of mask M and the first shot area on wafer W by finely driving wafer stage WST, based on the measurement results of the pair of alignment system ALA and alignment system ALB used earlier to set the position of mask M as described above.

Then, after the alignment, by simultaneously measuring an alignment mark on wafer W which is within a detection area of each alignment system and an alignment mark on mask M using the plurality of pairs of alignment system ALA and alignment system ALB, a difference between distortion of the pattern area of mask M and distortion of an underlying pattern formed in a shot area on wafer W (displacement of distortion between the two) is obtained. In this case, the underlying pattern is a pattern that has been formed on wafer W in advance, and refers to a pattern serving as an underlay on which the pattern formed on mask M is overlaid and is transferred and formed.

And, main controller 20 sets one of small exposure field SEF for XY-scan exposure, middle exposure field MEF for Y-scan exposure, and overall exposure field LEF for batch exposure specified by an operator, or according to the exposure accuracy that is required. Then, main controller 20 performs the exposure previously described using the near-field light in a method corresponding to the exposure field that has been set, and overlays and transfers the pattern of mask M onto the first shot area on wafer W. In this case, main controller 20 finely drives wafer stage WST in the X, the Y, and the θz directions (especially in the case of XY-scan exposure or Y-scan exposure, driving direction and/or driving amount should be continuously changed according to the progress of exposure beam IL) based on the difference information between the distortion of the pattern area of mask M and the distortion of the underlying pattern formed in the shot area on wafer W that are obtained as described above, so that the difference becomes as small as possible, and optimizes the overlay of the pattern of mask M and the underlying pattern formed in the first shot area on wafer W. This optimization of the overlay is performed on an exposure field basis.

Figure 16A:
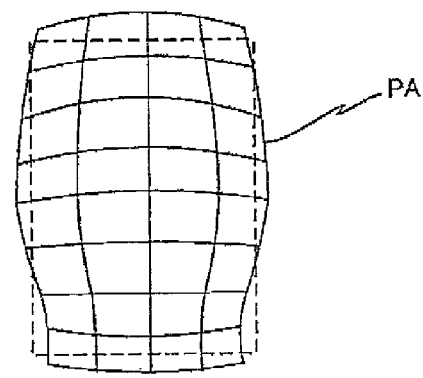
FIGS. 16A to 16D are views used to describe optimization of an overlay of a mask and a shot area of a wafer.
Figure 16B:
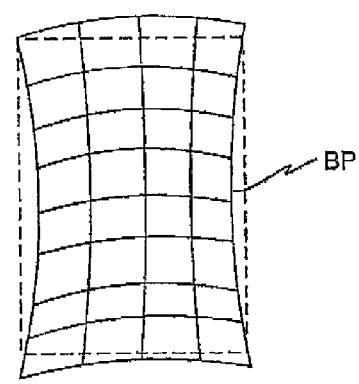
Figure 16C:
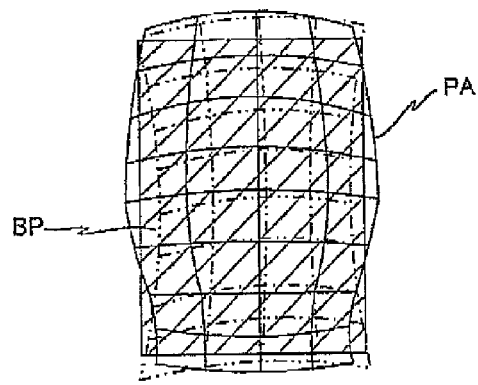
Figure 16D:
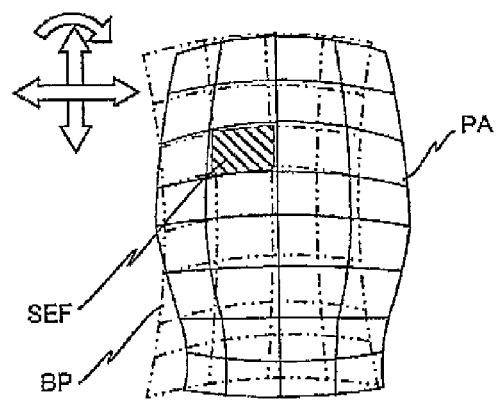

For example, a case will be considered when pattern area PA of mask M has a distortion shown by a solid line in FIG. 16A, and an underlying pattern BP on wafer W has a distortion shown by a solid line in FIG. 16B. In this case, when optimization of the overlay described above is performed at the time of batch exposure under the setting of overall exposure field LEF for batch exposure, an overlay of the pattern of mask M and the underlying pattern shown hatched in FIG. 16C can be realized within the exposure field (in this case, within the shot area). Meanwhile, in the case optimization of the overlay described above is performed at the time of XY-scan exposure under the setting of small exposure field SEF for XY-scan exposure, an overlay of the pattern of mask M and the underlying pattern shown hatched in FIG. 16D is realized within small exposure field SEF. Accordingly, it can be seen that a smaller exposure field allows a finer control, which improves the overlay accuracy.

Figure 17A:
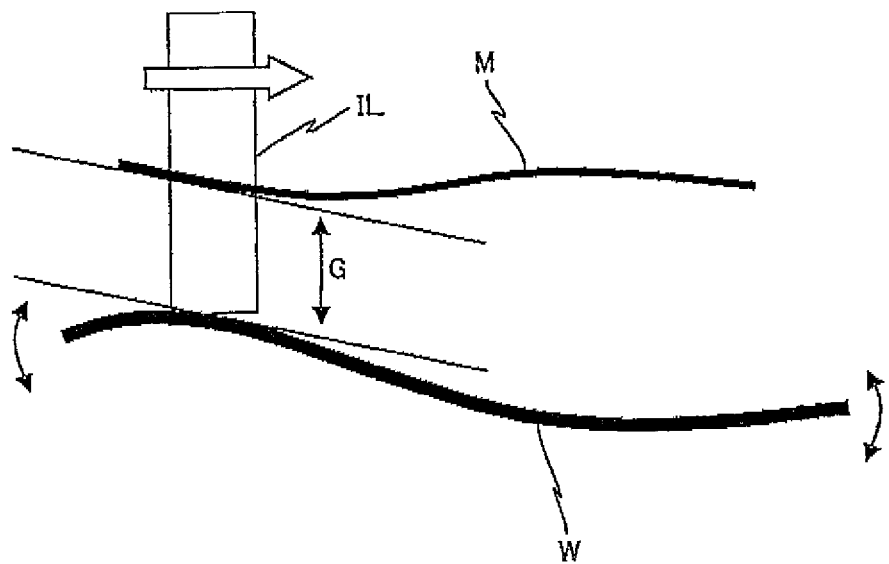
FIG. 17A and FIG. 17B are views used to describe optimization of an image plane within an exposure field.
Figure 17B:
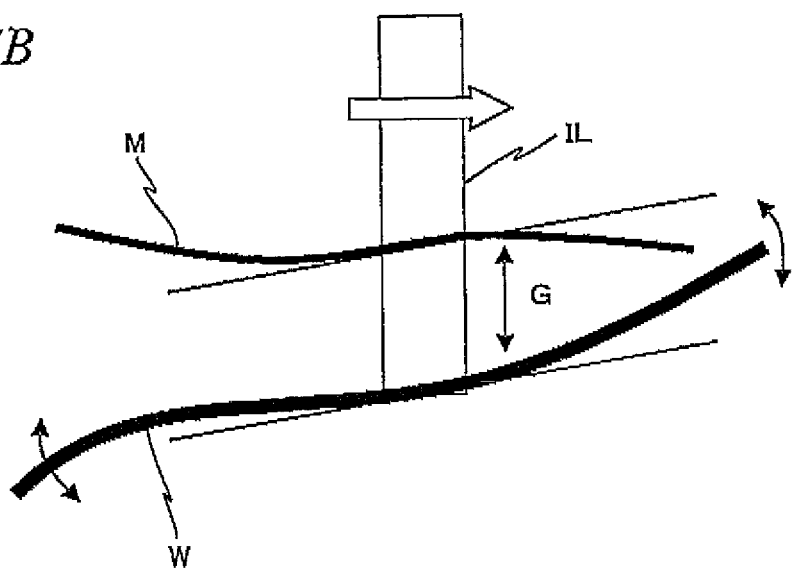

Further, especially in the case of performing XY-scan exposure or Y-scan exposure, main controller 20 performs optimization of the image plane within the exposure field during the exposure in the following manner. That is, although mask M is chucked by mask table MTB so that it is made to be flat as much as possible, mask M is not completely flat. However, the surface information of the pattern surface of mask M is already measured at this point as is previously described. Therefore, main controller 20 performs Z leveling drive on wafer stage WST via wafer stage driving system 27, based on the surface information of the pattern surface of mask M and the measurement values of wafer interferometer system 18 so that with the progress of exposure beam IL, in the exposure field on which exposure beam IL is irradiated, gap G between the pattern surface of mask M and the resist surface on wafer W is constant as much as possible and the pattern surface of mask M and the resist surface on wafer W are parallel to each other, as shown in FIGS. 17A and 17B.

Then, when exposure of the first shot area on wafer W is completed, main controller 20 performs a stepping between shots of wafer stage WST by a predetermined stepping distance in the X-axis direction (or the Y-axis direction) so as to position the second shot area on wafer W directly below mask M. In this case, in the present embodiment, main controller 20 drives at least one of wafer stage WST and mask M in the Z-axis direction by a predetermined amount to widen gap G between the pattern surface of mask M and the resist surface on wafer W. The reason for this is as follows. In the exposure using the near-field light, control of gap G has to be performed at the same level as the line width of the pattern, or in other words, in the present embodiment, such control of the gap is realized by the Z leveling drive of wafer stage WST described above. Therefore, in the case stepping between shots of wafer stage WST is performed in the state at the time of exposure, because mask M and wafer W may interfere with each other, in order to avoid this for certain, gap G is to be widened once on stepping between shots.

When the second shot area on wafer W is positioned almost directly below mask M after the stepping between shots of wafer stage WST, position setting (alignment) of mask M and the second shot area on wafer W is performed in a manner similar to the previous description. However, because alignment of mask M is completed prior to the alignment of mask M and the first shot area on wafer W, main controller 20 performs position setting (alignment) of mask M and the second shot area on wafer W by finely driving wafer stage WST, based on the measurement results of the pair of alignment system ALA and alignment system ALB previously described. The case of alignment of mask M and the third shot area on the wafer and the shot areas thereinafter is also performed in a similar manner.

Then, as is previously described, after obtaining the difference between distortion of the pattern area of mask M and distortion of the underlying pattern formed in the shot area on wafer W (displacement of distortion between the two) using the plurality of pairs of alignment system ALA and alignment system ALB, exposure is performed in a manner similar to the description earlier so as to transfer the pattern of mask M onto the second shot area on wafer W.

Hereinafter, similar to the description above, the pattern of mask M is transferred onto shot areas from the third shot area onward on wafer W by the step and repeat method, by sequentially repeating stepping between shots, alignment (including measuring the difference between distortion of the pattern area of mask M and distortion of the underlying pattern on wafer W), and exposure.

Then, at the point when exposure to all of the shot areas on wafer W has been completed, main controller 20 moves wafer stage WST again to the position shown in FIG. 13A, and then, after performing unloading of wafer W and loading of a new wafer, similar to the description earlier, sequentially executes measurement of the distribution of the Z position information and correction of unevenness, alignment operation, and exposure operation and the like on the new wafer.

In this case, when the exposure operation described above is repeated successively on a plurality of number of wafers W, distortion may occur in the pattern area of mask M due to thermal deformation of mask M. Therefore, main controller 20 measures the distortion of the pattern area of mask M using aerial image measuring instrument 82 provided in assisting stage AST previously described at a predetermined interval, for example, each time exposure on a predetermined number of wafers W has been completed, and corrects the distortion using plane VCM 65 until the next exposure begins.

And, overlay errors caused by distortion components of mask M which could not be corrected are also corrected (removed) on the optimization of the overlay of the pattern of mask M and the underlying pattern previously described.

However, in the present embodiment, during exposure, an alignment mark on mask M and an alignment mark on wafer W that are within the detection areas of each alignment system can be simultaneously measured, using the plurality of pairs of alignment system ALA and alignment system ALB. Accordingly, main controller 20 can perform correction of the distortion of the pattern area of mask M and the optimization of the overlay described above, using a plane VCM60, while continuing the measurement during exposure.

Figure 18A:
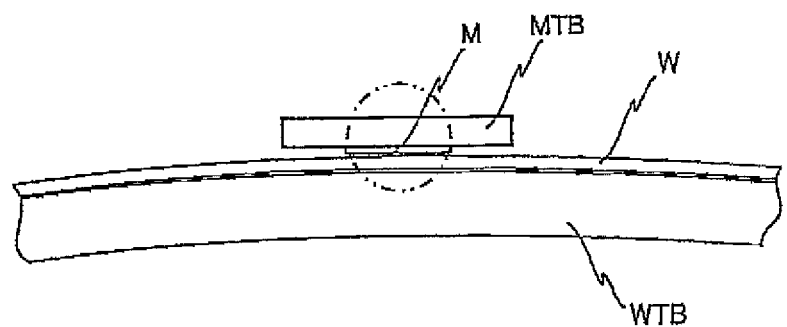
FIG. 18A is a view used to describe a method of preventing interference of a mask and a wafer at the time of exposure operation.
Figure 18B:
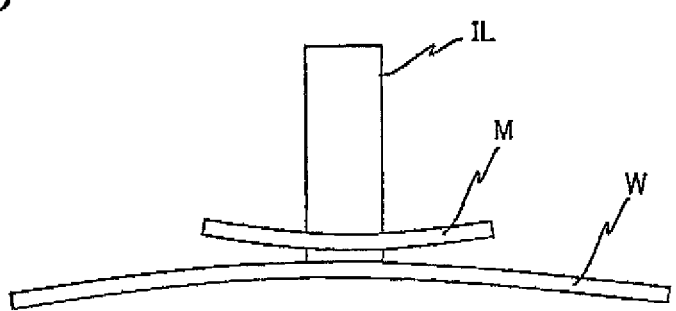
FIG. 18B is an enlarged view of FIG. 18A.

Further, in the present embodiment, as is described above, by main controller 20 widening gap G previously described once on the stepping between shots, interference between mask M and wafer W can be avoided. In addition, as is shown in FIG. 18A and in FIG. 18B which typically shows an enlarged view of a circle shown in FIG. 18A, when pin chuck member (table section) 60 is made to hold wafer W so that an arc-like shape curve that is an upward convex is generated entirely in wafer W, or after this operation, pin chuck member (table section) 60 can be deformed via the plurality of actuators 51, and when pin chuck platen 66 is made to hold mask M so that an arc-like shape curve that is a downward convex is generated entirely in mask M, or after this operation, pin chuck platen 66 can be deformed via plane VCM60. As is shown as an example in FIG. 18B, this allows mask M and wafer W to move into a state where only the part inside the exposure field (irradiation area of exposure beam IL) is in proximity and other parts are distanced away, which makes it possible for mask M and wafer W to avoid interference for certain. In this case, the magnitude of curvature radius of the warping of mask M and the warping of wafer W is set in a range where uniformity of gap G within the exposure field can be sufficiently secured.

Incidentally, while both mask M and wafer W were deformed in the description above, the present invention is not limited to this, and either mask M or wafer W can simply be deformed (warped) so that a warpage having a downward or an upward convex is generated. Further, at least one of mask M and wafer W can be warped beforehand at once, or at least one of mask M and wafer W can be warped by one or a plurality of shot areas at a time. Further, the timing to warp at least one of mask M and wafer W can be just before the stepping, or after the stepping has begun.

As is described in detail so far, according to exposure apparatus 100 of the present embodiment, mask table MTB holding mask M can hold the periphery of the pattern area of mask M (chucking area CA) from above, and can also apply a force at least within a plane parallel to the XY plane with respect to mask M. Therefore, although exposure apparatus 100 is an exposure apparatus that does not use a projection optical system, exposure apparatus 100 can apply a force to cope with deformation of mask M, such as for example, deformation (distortion, magnification variation) of the pattern on mask M caused by thermal deformation of the mask so as to reduce such deformation. Accordingly, it becomes possible to realize an overlay with high precision of the pattern of mask M and the underlying pattern in each shot area on wafer W. Further, when exposure apparatus 100 of the present embodiment is used, fine patterns including a pattern whose line width is equal to or smaller than the resolution limit in a normal exposure by an optical exposure apparatus can be realized, without depending on a double patterning method and the like. Furthermore, as it can be seen from the description concerning the structure of the apparatus previously described, because exposure apparatus 100 does not require a projection optical system or devices related to liquid immersion exposure which are costly, the manufacturing cost can be considerably lower than when a conventional liquid immersion exposure apparatus is used.

Incidentally, in the embodiment described above, while three types of exposure fields having different sizes and shapes could be set in exposure apparatus 100, which are overall exposure field LEF for batch exposure, middle exposure field MEF for Y-scan exposure, and small exposure field SEF for XY-scan exposure, the present invention is not limited to this setting, and the exposure field that can be set may be only one or two, out of the three types of exposure fields. For example, the setting can be only middle exposure field MEF and small exposure field SEF. In such a case, main controller 20 performs a scanning exposure in which mask M, wafer W, and exposure beam IL are relatively scanned to expose wafer W. In this case, main controller 20 does not perform batch exposure in which wafer W is exposed in a state where mask M, wafer W, and exposure beam IL are stationary. Further, in the embodiment described above, while three types of exposure fields having different sizes and shapes could be set in exposure apparatus 100, which are overall exposure field LEF for batch exposure, middle exposure field MEF for Y-scan exposure, and small exposure field SEF for XY-scan exposure, and exposure was performed in three methods according to each setting, the present invention is not limited to the three types of exposure fields described above, and the setting can be simply another exposure field having a size and shape different from the three types of exposure fields described above, or the another exposure field and at least one of the three exposure fields described above. In this case as well, exposure is performed in the method according to the exposure field that is set. Further, as the exposure method, the exposure method is not limited to the three methods described above, and the exposure method employed can simply be another exposure method other than the three methods described above, or the another exposure method can be combined to at least one of the three methods described above.

Further, in the embodiment described above, while the case has been described where mask M is a fine pattern which includes a pattern whose line width is equal to or smaller than the resolution limit in a normal exposure by an optical exposure apparatus, exposure apparatus 100 in the embodiment above can be suitably used not only when transferring such fine patterns, but also when transferring a pattern whose line width is larger than the resolution limit in a normal exposure by an optical exposure apparatus. Accordingly, the resist which should be coated on the wafer, as a matter of course, is not limited to a multilayer resist such as a double layer resist.

Further, in the embodiment described above, while the case has been described where a wafer is exposed using a near-field light and a pattern of a mask is transferred on the wafer, for example, in the case of transferring a pattern whose line width is larger than the resolution limit in a normal exposure by an optical exposure apparatus onto a wafer, a normal exposure or a liquid immersion exposure that does not use the near-field light can be performed. Even in such a case, the method of optimizing the overlay of the pattern of the mask and the underlying pattern on the wafer by finely moving the wafer concurrently with the exposure (scanning exposure described above or batch exposure) is effective in the case of an overlay with high precision of the pattern of the mask and the underlying pattern on the wafer.

Incidentally, in the embodiment described above, while the case has been described where optimization of the pattern of the mask and underlying pattern on the wafer described above was performed on an exposure field basis, the present invention is not limited to this, and for example, in the case middle exposure field MEF for Y-scan exposure or small exposure field SEF for XY-scan exposure is set, the optimization of the overlay described above can be performed on a shot area basis, or with an area (different from the size and shape of the exposure fields used in the setting) which is a plurality of areas in a shot area that is divided equally, serving as a basis. Further, stationary exposure can be performed on such an overlay optimization basis.

Further, as for the optimization of the overlay of the pattern of the mask and the pattern on the wafer, at least one of wafer stage WST and mask M can be finely driven in the X, the Y, and the θz directions (especially in the case of XY-scan exposure or Y-scan exposure, driving direction and/or driving amount should be continuously changed according to the progress of exposure beam IL), as well as making gap G between the pattern surface of mask M and the resist surface on wafer W be constant and mutually parallel as much as possible in the exposure field on which exposure beam IL is irradiated, or only at least one of wafer stage WST and mask M can be finely driven in the X, the Y, and the θz directions, or only gap G between the pattern surface of mask M and the resist surface on wafer W can be made constant and mutually parallel as much as possible (performs optimization of the image plane described above). Main controller 20 can decide the method of optimization of the overlay of the pattern of the mask and the pattern on the wafer according to instructions from an operator, or by taking into consideration at least one of exposure accuracy and throughput that is required.

Incidentally, the light source of the exposure apparatus in the embodiment described above is not limited to an extra-high pressure mercury lamp, or to an ArF excimer laser, and a pulse laser light source such as a KrF excimer laser (output wavelength: 248 nm), an F2 laser (output wavelength: 157 nm), an Ar2 laser (output wavelength: 126 nm) or a Kr2 laser (output wavelength: 146 nm) or the like can also be used. Further, a harmonic generator of a YAG laser can also be used. Besides this, as disclosed in, for example, U.S. Pat. No. 7,023,610, a harmonic wave (vacuum ultraviolet light), which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment described above, it is a matter of course that illumination light IL of the exposure apparatus is not limited to light having a wavelength of 100 nm or over, and light having a wavelength less than 100 nm can also be used. More particularly, light having a wavelength of 50 nm or less, or to be more specific, an EUV light having a wavelength of around 11 nm or 13 nm, can be used.

Incidentally, surface information measurement devices 50a and 50b related to the embodiment described above can measure the flatness of the resist surface without being in contact with the resist on wafer W. However, besides this, if a similar measurement is possible, for example, a measurement device which measures the size of a space (gap) in between two objects by pouring a fluid in the gap and measuring the flow velocity (also called an air gauge) can be used to measure the unevenness of the wafer surface and/or the pattern surface of the mask. Further, Z leveling driving of the wafer stage during exposure can be performed while maintaining gap G previously described in a constant manner, using such a measurement device. Incidentally, at least one of surface information measurement devices 50a and 50b and mask surface information measurement device 50c can employ an optical detection method.

Further, in the exposure apparatus of the embodiment described above, while an encoder system can be used instead of, or together with the laser interferometer as the measurement device for measuring position information of wafer stage WST, as this encoder system, either a method in which a grating is provided on wafer table WTB, and facing the grating, an encoder head is placed external to wafer stage WST, such as, for example, in support member 38 structuring body BD, or conversely, a method in which an encoder head is provided on wafer table WTB, and facing the encoder head, a scale member having a grating is placed external to wafer stage WST, such as, for example, in support member 38 structuring body BD, can be employed. As the encoder system which employs the former method, an encoder system similar to the one whose details are disclosed in, for example, U.S. Patent Application Publication No. 2008/0088843 and the like can be used, and as the encoder system which employs the latter method, an encoder system similar to the one whose details are disclosed in, for example, U.S. Patent Application Publication No. 2006/0227309 and the like can be used. The same can be said in the case of measuring position information of the assisting stage by the encoder system.

Incidentally, the object on which the pattern should be formed in the embodiment described above (the object subject to exposure on which the energy beam is irradiated) is not limited to a wafer, and can be other materials such as a glass plate, a ceramic substrate, a film member, a mask blank or the like. Further, in the embodiment described above, while a mask made of a glass substrate is used, the mask may be made of a substrate other than a glass substrate.

The usage of the exposure apparatus is not limited to the exposure apparatus used for producing semiconductor devices, and for example, the exposure apparatus can also be widely applied to an exposure apparatus for liquid crystal displays used to transfer a liquid crystal display device pattern on a square shaped glass plate, or an exposure apparatus used to manufacture an organic EL, a thin film magnetic head, an imaging device (such as a CCD), a micromachine, a DNA chip and the like. Further, the embodiment described above can also be applied not only to an exposure apparatus for producing microdevices such as semiconductor devices, but also to an exposure apparatus which transfers a circuit pattern on a glass substrate or a silicon wafer, in order to manufacture a reticle or a mask used in a light exposure apparatus, an EUV exposure apparatus, an X-ray exposure apparatus, and an electron beam exposure apparatus and the like.

Further, the exposure apparatus of the embodiment described above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Device Manufacturing Method

Next, a manufacturing method of a microdevice that uses exposure apparatus 100 described in the embodiments above used in a lithography process will be described next.

Figure 19:
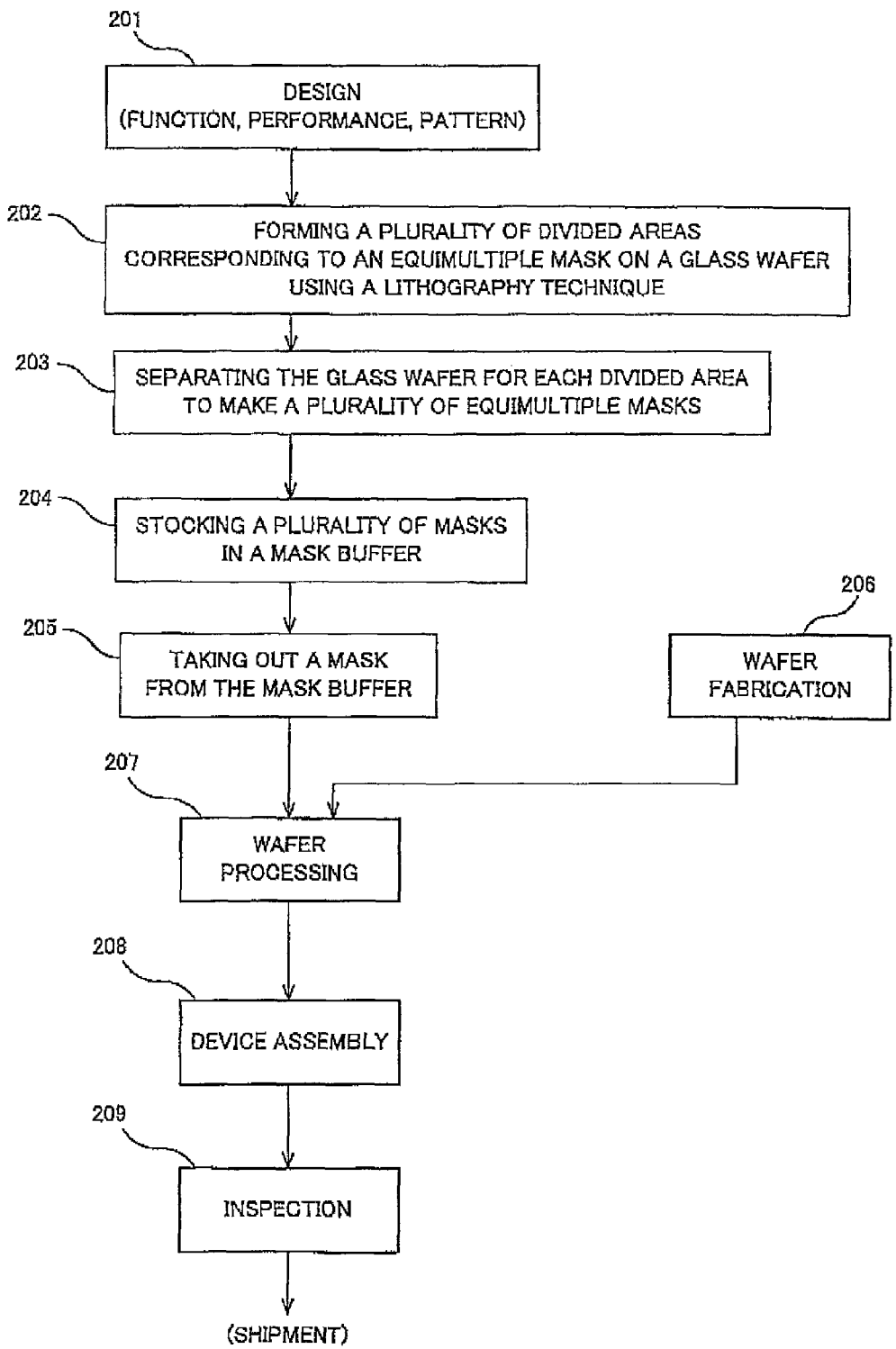
FIG. 19 is a flow chart used to describe an embodiment of a device manufacturing method.

FIG. 19 shows a flowchart of an example when manufacturing a device (a semiconductor chip such as an IC or an LSI, a liquid crystal panel, a CCD, a thin film magnetic head, a micromachine, and the like). As shown in FIG. 19, first of all, in step 201 (a design step), function and performance design of a device (such as circuit design of semiconductor device) is performed, and pattern design to realize the function is performed.

Figure 20:
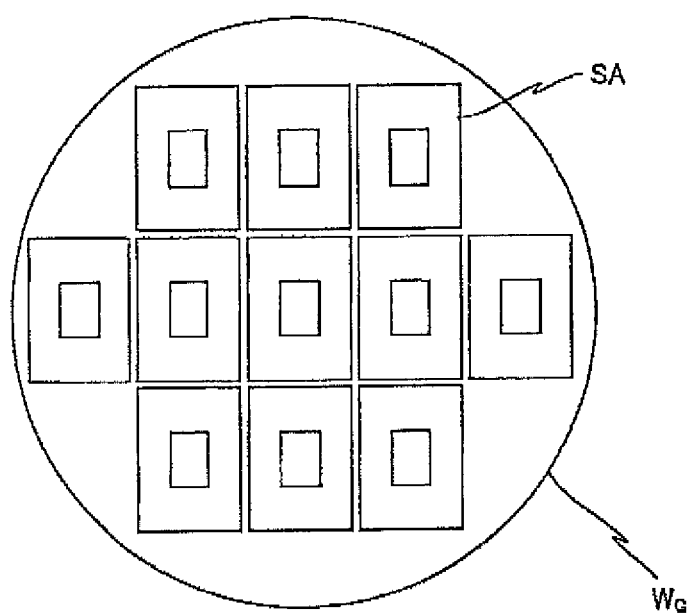
FIG. 20 is a view showing an example of a glass wafer on which a plurality of divided areas is formed.

Then, in step 202, a plurality of divided areas corresponding to a mask is formed on a glass wafer which is a kind of glass substrate, using a lithography technique. FIG. 20 shows an example of a glass wafer $W_G$ on which a plurality of divided areas SA is formed. In each of the plurality of divided areas SA of this glass wafer $W_G$, a pattern area in which the circuit pattern designed in step 201 is formed, and a light shielding area in the periphery of the pattern area serving as a chuck area are formed.

In this case, because the plurality of divided areas SA is formed on glass wafer $W_G$, even when a fine pattern whose line width is equal to or smaller than the resolution limit in a normal exposure by an optical exposure apparatus is included within the pattern area, by using the latest reduction projection exposure apparatus, such as, for example, a liquid immersion scanner which uses an ArF excimer laser as the exposure light source, and making full use of the so-called double patterning method, the plurality of divided areas SA including the fine pattern described above can be formed. Besides this, the fine pattern described above can also be formed, using an electron beam exposure apparatus.

Here, for example, in the case of using a reduction projection exposure apparatus when forming the plurality of divided areas on glass wafer $W_G$, for example, since the pattern of a master reticle that should be transferred onto glass wafer $W_G$ is in almost all cases, four times or more the line width of the fine pattern which is to be transferred onto glass wafer $W_G$, the pattern can be formed on a reticle substrate using the latest reduction projection exposure apparatus described above (a liquid immersion scanner which uses an ArF excimer laser as the exposure light source) and the like, by a normal exposure without depending on the so-called double patterning. That is, it is possible to make a set of master reticles that each has a circuit pattern of a plurality of layers that are used to manufacture a device within a short time. In the case the line width of the pattern that should be formed in the pattern area of glass wafer $W_G$ becomes finer, the pattern of the master reticle can also be formed using the double patterning method. Here, the double patterning method is not limited to the so-called double exposure method in which development of the glass wafer is not performed between a first exposure and a second exposure, and also includes a double patterning method in which the glass wafer on which a resist pattern is formed by a first exposure is developed after the first exposure, and after the development, a second exposure is performed.

In the next step, step 203, glass wafer $W_G$ is separated (dicing), for example, using a dicing saw not shown per each divided area SA not shown. This simultaneously makes a plurality of masks (equimultiple mask) M (at once).

Next, in step 204, the plurality of masks that is made is stocked in a mask buffer. Here, mask M is an equimultiple mask, and because the length of the long side is 100 mm or less, needless to say, the masks can be housed in a mask buffer in which a plurality of masks can be simultaneously stocked, or, for example, in a mask buffer in which the masks can be handled separately, as in a disposable contact lens.

In the next step, step 205, mask M is taken out from the mask buffer to be installed into the exposure apparatus.

Concurrently with at least a part of step 202 to step 205, in step 206 (wafer fabrication step), a wafer is manufactured from materials such as silicon and the like.

Next, in step 207 (wafer processing step), the actual circuit and the like is formed on the wafer by a lithography technique and the like, using the mask and the wafer prepared in step 201 to step 206.

Next, in step 208 (device assembly step), device assembly is performed using the wafer processed in step 207. Step 208 includes processes such as the dicing process, the bonding process, and the packaging process (chip encapsulation), and the like when necessary.

Finally, in step 209 (inspecting step), inspections such as the operation check test, the durability test and the like of a device made by step 208 are performed. After these processes, the devices are completed and are shipped out. Incidentally, in the description above, while step 206 (wafer fabrication step) is performed concurrently with at least a part of step 202 to step 205, the present invention is not limited to this, and the wafer fabrication step in which a wafer is manufactured from materials such as silicon and the like can be performed prior to step 202. That is, a wafer manufactured by a wafer manufacturer can be purchased in advance regardless of the device manufacturing process, and the wafer can be used in each process from step 207 onward.

Figure 21:
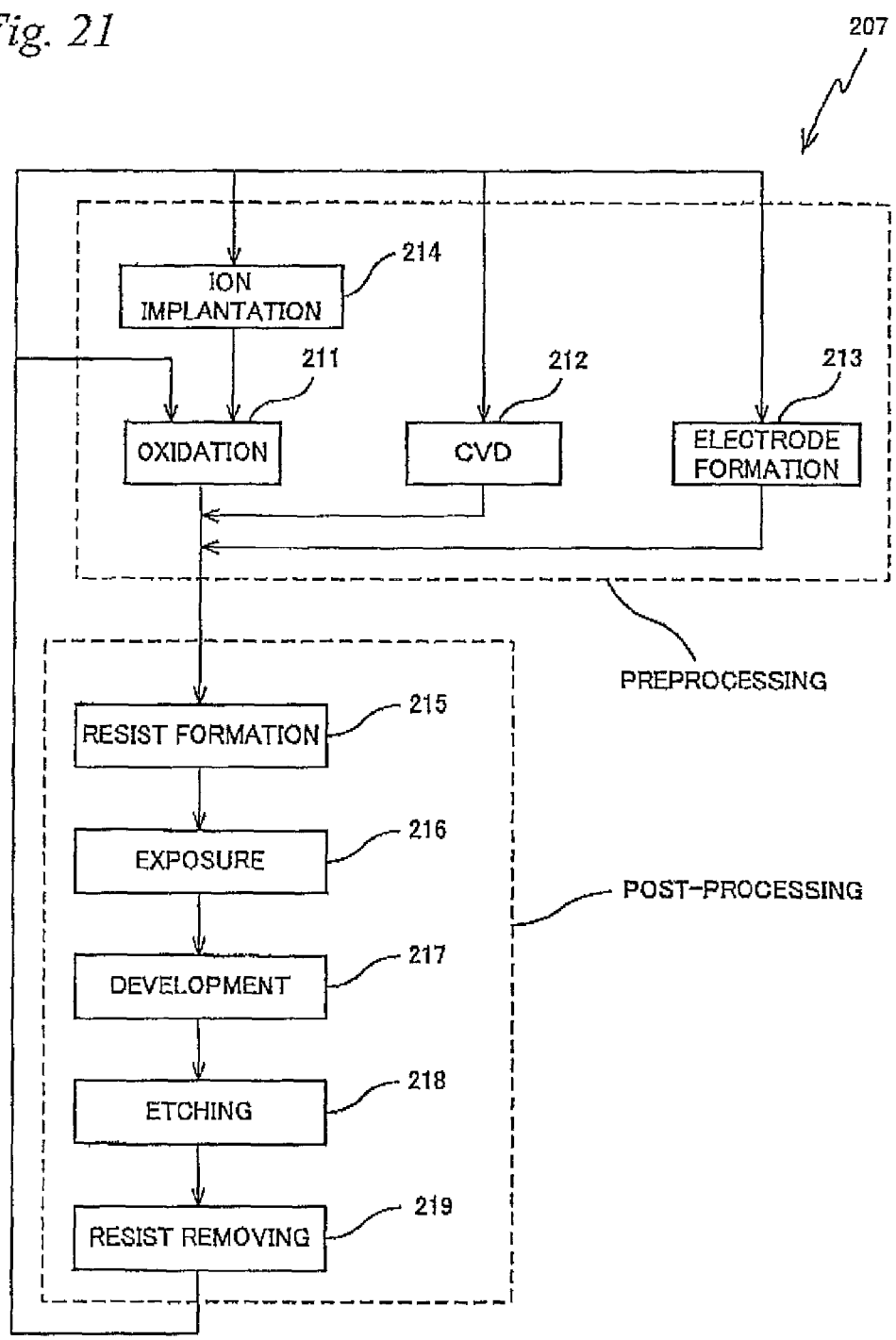
FIG. 21 is a flow chart showing a concrete example of step 207 in FIG. 19.

FIG. 21 is a flowchart showing a detailed example of step 207 described above in the case of manufacturing semiconductor devices. In FIG. 21, the surface of wafer is oxidized in step 211 (oxidation step). In step 212 (CDV step), an insulating film is formed on the wafer surface. In step 213 (an electrode formation step), an electrode is formed on the wafer by deposition. In step 214 (an ion implantation step), ions are implanted into the wafer. Each step from step 211 to step 214 described above constitutes the preprocessing in each step of wafer processing, and the necessary processing is chosen and is executed at each stage.

In each step of wafer processing, when the preprocessing described above is completed, post-processing steps are executed in the following manner. In the post-processing step, initially, in step 215 (resist formation step), a photoresist (photosensitive agent) is coated on wafer W. Here, in the case of forming the pattern of mask M using exposure apparatus 100 described above, positive resist 4 and negative silylation resist 3 previously described are coated in a layered state on wafer W on which a thin film for pattern forming is formed.

Then, in step 216 (exposure step), the circuit pattern of mask M is transferred onto wafer W by exposure apparatus 100 and the exposure method. Prior to this, mask M is installed in exposure apparatus 100. The circuit pattern transfer in this case, as is previously described, is performed in a proximity method using a near-field light. Next, to wafer W which has been exposed, PEB is performed as necessary, and furthermore, silylation of wafer W (on photosensitive section of negative resist 3) is performed.

Next, in step 217 (development step), wafer W which has been exposed is developed. Here, in the case the exposure previously described is performed using exposure apparatus 100, for example, dry development which is etching that acts on both the positive resist and the negative resist is performed.

In the next step, step 218 (etching step), substrate processing including heating (curing), etching and the like of wafer W is performed within an etching device so as to perform pattern forming on wafer W with the resist pattern serving as a mask layer.

Then, in step 219 (resist removing step), by removing (stripping) the resist which is no longer necessary when the etching is completed, an equally magnified circuit pattern of the pattern of mask M is formed on the thin film on the wafer W surface.

By repeatedly performing the preprocessing steps and the post-processing steps, a multiply-layered circuit pattern is formed on a wafer.

When using the device manufacturing method of the present embodiment described so far, the exposure apparatus and the exposure method of the embodiment described above can be used in the exposure process (step 216), therefore, exposure with high throughput can be performed, while maintaining high overlay accuracy. Accordingly, it becomes possible to produce highly integrated microdevices on which fine patterns are formed with good productivity.

In addition, in the device manufacturing method of the present embodiment, because mask M used in exposure apparatus 100 is made using a glass wafer as a substrate, it becomes possible to make a plurality of masks simultaneously, using a reduction projection exposure apparatus, an electron beam exposure apparatus for the making of the mask even if an extremely fine pattern is included in the pattern of mask M. Especially in the case of using a reduction projection exposure apparatus, a large number of copy masks (equal magnification) can be made from one set of a master reticle (for example, fourfold). This also can decrease the cost of a reticle. Further, the set of a master reticle can be made within a short period of time.

Incidentally, contamination of mask M can be considered because the exposure by exposure apparatus 100 is a proximity exposure which is in close proximity, however, because mask M is made using a glass wafer as a substrate, manufacturing cost is inexpensive. Accordingly, while a plurality of used masks can be cleaned collectively for reuse, a plurality of masks M can each be installed in exposure apparatus 100 at a predetermined interval without waiting for this cleaning, and in step 206 described above, exposure apparatus 100 can sequentially transfer the pattern of mask M that has been installed onto each of the number of wafers corresponding to the interval, each time mask M is installed. Besides this, mask M can be disposable, without being reused.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus which transfers a pattern formed on a mask onto a photosensitive substrate placed in proximity to the mask, the apparatus comprising:
   an illumination optical device which illuminates the mask with an energy beam;
   a mask holding device which holds a periphery area of a pattern area of the mask from above, and applies forces that act on the mask at least within a plane parallel to a predetermined plane to deform the mask; and
   a substrate holding device which holds the substrate and moves along the predetermined plane, wherein
   the mask holding device has
      a plurality of actuators placed in the periphery area of the pattern area, and
      a freely deformable chuck member that holds the mask and is fixed to surfaces of the plurality of actuators that face the substrate, the freely deformable chuck member being different from the actuators.

2. The exposure apparatus according to claim 1, wherein the chuck member consists of a film-like member.

3. The exposure apparatus according to claim 1, wherein the chuck member holds the mask by one of a vacuum suction, an electrostatic suction, and a mechanical method.

4. The exposure apparatus according to claim 1, wherein each of the plurality of actuators is a planar motor which generates a first driving force in a first direction and a second driving force in a second direction that are parallel to the predetermined plane and are orthogonal to each other.

5. The exposure apparatus according to claim 4, wherein each of the planar motors is a magnetic levitation planar motor which further generates a third driving force in a third direction orthogonal to the predetermined plane.

6. The exposure apparatus according to claim 1, further comprising:
   a mask surface information measurement device which measures unevenness of a pattern surface of the mask.

7. The exposure apparatus according to claim 1, further comprising:
   a mark detection system which detects a position of a mark formed on the mask.

8. The exposure apparatus according to claim 7, wherein the mark detection system further detects a position of a mark formed on the substrate via the mask.

9. The exposure apparatus according to claim 1, wherein the substrate holding device includes
a freely deformable substrate chuck member which holds the substrate substantially parallel to the predetermined plane, and
a flatness adjustment device which adjusts a flatness of the substrate held by the substrate chuck member.

10. The exposure apparatus according to claim 9, wherein the substrate chuck member consists of one of a flexible material and an elastic material which deforms when a force is applied to the elastic material.

11. The exposure apparatus according to claim 9, wherein the substrate chuck member holds the substrate by one of a vacuum suction, an electrostatic suction, and a mechanical method.

12. The exposure apparatus according to claim 9, wherein the flatness adjustment device includes a plurality of second actuators placed two-dimensionally inside the substrate holding device, the plurality of second actuators supporting the substrate chuck member at each of a plurality of supporting points and changing a position of the supporting point in a direction orthogonal to the predetermined plane.

13. The exposure apparatus according to claim 12, wherein
each of the plurality of second actuators includes a magnet, and a coil which generates a magnetic attraction force and a magnetic repulsion force with respect to the magnet.

14. The exposure apparatus according to claim 9, further comprising:
a substrate surface information measurement device which measures unevenness of a surface of a photosensitive layer on the substrate held by the substrate holding device, when the substrate holding device moves in a predetermined moving direction parallel to the predetermined plane.

15. The exposure apparatus according to claim 14, wherein
the substrate surface information measurement device has a levitated body which floats above the surface of the photosensitive layer of the substrate by an amount corresponding to a moving velocity of the substrate holding device, by a dynamic pressure of an airflow generated when the substrate holding device moves in the moving direction, and a measuring equipment which measures position information of a surface on an opposite side of a surface on a side of the levitated body facing the substrate, in a direction perpendicular to the predetermined plane.

16. The exposure apparatus according to claim 15, wherein
the substrate surface information measurement device further has a calculation device which calculates unevenness of the surface of the photosensitive layer from measurement results obtained by the measuring equipment.

17. The exposure apparatus according to claim 15, wherein
the measuring equipment is one of a capacitance sensor and an optical sensor.

18. The exposure apparatus according to claim 15, wherein
the levitated body includes a plurality of levitated portions distributed in a plurality of places at least in a direction intersecting the moving direction of the substrate holding device, and
the measuring equipment includes a plurality of measuring portions, corresponding to the levitated portions of the levitated body.

19. The exposure apparatus according to claim 18, wherein
sets of the levitated body and the measuring equipment which define a surface position sensor line are placed at predetermined intervals in the direction intersecting the moving direction, and
the surface position sensor line is placed in two lines, separated from each other in the moving direction.

20. The exposure apparatus according to claim 14, wherein
two of the substrate surface information measurement devices are placed in the moving direction away from the mask holding device and away from each other, and
a first one of the two substrate surface information measurement devices is used to adjust the flatness of the substrate by the flatness adjustment device, and a second one of the two substrate surface information measurement devices is used to confirm an adjustment state of the flatness of the substrate by the flatness adjustment device.

21. The exposure apparatus according to claim 20, wherein
the first substrate surface information measurement device is placed away from the mask holding device in the moving direction, with respect to the second substrate surface information measurement device.

22. The exposure apparatus according to claim 1, further comprising:
a controller which exposes the substrate by controlling at least the illumination optical device of (i) the illumination optical device, and (ii) the mask holding device and the substrate holding device, and moves the substrate holding device holding the substrate during the exposure to perform an overlay of the pattern of the mask and a pattern on the substrate.

23. The exposure apparatus according to claim 22, wherein
the controller moves and/or deforms at least one of the mask and the substrate so that a pattern surface of the mask and a surface of the substrate become substantially parallel within an irradiation area of the energy beam, via at least one of the mask holding device and the substrate holding device, during the exposure.

24. The exposure apparatus according to claim 22, wherein
the controller exposes the substrate by the energy beam via the mask, in a state where the energy beam is stationary on a surface including the pattern area of the mask, during the exposure.

25. The exposure apparatus according to claim 22, further comprising:
a field setting device which sets an exposure field having a size and a shape corresponding to external instructions or a required exposure accuracy, wherein
the controller performs exposure by a method corresponding to the exposure field that has been set.

26. The exposure apparatus according to claim 25, wherein
the field setting device can set at least one of a first exposure field having a size and a shape of the pattern area divided along a two-dimensional direction, and a second exposure field having a size and a shape of the pattern area divided in a predetermined direction as the exposure field.

27. The exposure apparatus according to claim 26, wherein
the first exposure field has a size and a shape of the pattern area which is equally divided along the two-dimensional direction.

28. The exposure apparatus according to claim 26, wherein
the second exposure field has a size and a shape of the pattern area that is divided in the predetermined direction.

29. The exposure apparatus according to claim 26, wherein
the controller exposes the substrate by scanning the mask and the substrate, relative to the energy beam, in the case that one of the first exposure field and the second exposure field is set.

30. The exposure apparatus according to claim 26, wherein
the field setting device further sets a third exposure field having the same size and shape as the pattern area as the exposure field, and
in the case that the third exposure field is set, the controller exposes the substrate in a state where the mask and the substrate, and the energy beam are stationary.

31. The exposure apparatus according to claim 22, wherein
the controller performs optimization of accuracy of the overlay on an exposure field basis.

32. The exposure apparatus according to claim 14, wherein
the controller drives the substrate via the flatness adjustment device, based on measurement results of the substrate surface information measurement device so that a pattern surface of the mask and a surface of the substrate are parallel reciprocally and that a constant gap is maintained between the pattern surface of the mask and the substrate during the exposure, at least within an area where the energy beam is irradiated.

33. The exposure apparatus according to claim 32, wherein the controller
causes a substrate-facing side of the mask to have a convex curvature, via the mask holding device, and
causes a mask-facing side of the substrate to have a convex curvature, via the flatness adjustment device.

34. The exposure apparatus according to claim 22, wherein
the controller temporarily widens a gap between the mask and the substrate when exposing each of a plurality of divided areas on the substrate on which the pattern is formed, during a stepping movement of the substrate between an exposure of one divided area and an exposure of a next divided area of the plurality of divided areas.

35. The exposure apparatus according to claim 34, wherein
the controller moves at least one of the mask and the substrate, to widen the gap between the mask and the substrate during the stepping movement of the substrate.

36. The exposure apparatus according to claim 34, wherein
the gap between the mask and the substrate is widened just before the beginning of the stepping movement of the substrate.

37. The exposure apparatus according to claim 34, wherein the controller
causes a substrate-facing side of the mask to have a convex curvature, via the mask holding device, and
causes a mask-facing side of the substrate to have a convex curvature, via the flatness adjustment device.

38. The exposure apparatus according to claim 1, further comprising:
a mask inspection device which inspects a presence of a defect of the mask, the defect including at least a foreign material adhering on the mask.

39. The exposure apparatus according to claim 1, further comprising:
an electrostatic eliminator which eliminates static electricity with which the mask is charged.

40. The exposure apparatus according claim 1, further comprising:
a movable body that is provided with various kinds of functional members, and moves along the predetermined plane independent from the substrate holding device.

41. The exposure apparatus according to claim 40, wherein
the movable body is provided with a mask inspection device, as one of the various kinds of functional members, the mask inspection device inspecting a presence of a defect of the mask, and the defect including at least a foreign material adhering on the mask.

42. The exposure apparatus according to claim 40, wherein
in the movable body, as one of the various kinds of functional members, an electrostatic eliminator which eliminates static electricity with which the mask is charged is provided.

43. A device manufacturing method comprising:
exposing a substrate using the exposure apparatus according to claim 1 to form a pattern on the substrate; and
developing the substrate on which the pattern has been formed.

* * * * *